(12) United States Patent  
Song et al.

(10) Patent No.: US 9,184,091 B2  
(45) Date of Patent: Nov. 10, 2015

(54) SEMICONDUCTOR DEVICE AND METHOD OF FORMING THE SAME

(71) Applicant: Samsung Electronics Co., Ltd.

(72) Inventors: Bo-Young Song, Seongnam-si (KR); Cheol-Ju Yun, Suwon-si (KR); Seung-Hee Ko, Seogwipo-si (KR); Jina Kim, Seoul (KR); Hyun-Gi Kim, Hwaseong-si (KR); Chae-Ho Lim, Seoul (KR)

(73) Assignee: SAMSUNG ELECTRONICS CO., LTD., Yeongtung-gu, Suwon-si, Gyeonggi-do (KR)

( * ) Notice: Subject to any disclaimer, the term of this patent is extended or adjusted under 35 U.S.C. 154(b) by 59 days.

(21) Appl. No.: 14/101,631

(22) Filed: Dec. 10, 2013

(65) Prior Publication Data

US 2014/0231892 A1 Aug. 21, 2014

(30) Foreign Application Priority Data

Feb. 19, 2013 (KR) ........................ 10-2013-0017623

(51) Int. Cl.
*H01L 23/522* (2006.01)
*H01L 21/768* (2006.01)
*H01L 27/108* (2006.01)

(52) U.S. Cl.
CPC ...... *H01L 21/7682* (2013.01); *H01L 21/76831* (2013.01); *H01L 21/76897* (2013.01); *H01L 27/10814* (2013.01); *H01L 27/10823* (2013.01); *H01L 27/10855* (2013.01); *H01L 27/10885* (2013.01); *H01L 27/10888* (2013.01); *H01L 27/10891* (2013.01)

(58) Field of Classification Search
CPC .................................................. H01L 23/5221
See application file for complete search history.

(56) References Cited

U.S. PATENT DOCUMENTS

| | | | |
|---|---|---|---|
| 6,492,245 B1 | 12/2002 | Liu et al. | |
| 7,183,603 B2 * | 2/2007 | Park | 257/298 |
| 7,560,375 B2 | 7/2009 | Filippi et al. | |
| 7,642,572 B2 * | 1/2010 | Popp et al. | 257/211 |
| 7,749,846 B2 * | 7/2010 | Seo et al. | 438/270 |
| 7,754,601 B2 | 7/2010 | Chen et al. | |
| 7,871,923 B2 | 1/2011 | Liu et al. | |
| 8,106,376 B2 | 1/2012 | Lai et al. | |
| 8,198,189 B2 | 6/2012 | Kim et al. | |
| 8,232,653 B2 | 7/2012 | Lee | |
| 8,519,462 B2 * | 8/2013 | Wang et al. | 257/298 |

(Continued)

FOREIGN PATENT DOCUMENTS

| | | |
|---|---|---|
| KR | 10-2001-0011638 A | 2/2001 |
| KR | 10-2005-0013830 A | 2/2005 |
| KR | 10-0672823 B1 | 1/2007 |

*Primary Examiner* — Lex Malsawma
(74) *Attorney, Agent, or Firm* — Muir Patent Law, PLLC

(57) ABSTRACT

First dopant regions and second dopant regions are provided at both sides of the gate structures. Conductive lines cross over the gate structures and are connected to the first dopant regions. Each of the conductive lines includes a conductive pattern and a capping pattern disposed on the conductive pattern. Contact structures are provided between the conductive lines and are connected to the second dopant regions. Each of the contact structures includes a lower contact pattern disposed on the second dopant region and an upper contact pattern disposed on the lower contact pattern. A bottom surface of the upper contact pattern is lower than a top surface of the conductive pattern.

17 Claims, 42 Drawing Sheets

(56) References Cited

U.S. PATENT DOCUMENTS

| | | | |
|---|---|---|---|
| 8,569,130 B2 * | 10/2013 | Mathew et al. | 438/257 |
| 2007/0096202 A1 | 5/2007 | Kang et al. | |
| 2009/0072409 A1 | 3/2009 | Nitta et al. | |
| 2012/0156855 A1 | 6/2012 | Sim | |
| 2012/0276711 A1 * | 11/2012 | Yoon et al. | 438/421 |

* cited by examiner

SEMICONDUCTOR DEVICE AND METHOD OF FORMING THE SAME

CROSS-REFERENCE TO RELATED APPLICATIONS

This U.S. non-provisional patent application claims priority under 35 U.S.C. §119 to Korean Patent Application No. 10-2013-0017623, filed on Feb. 19, 2013, the entirety of which is incorporated by reference herein.

BACKGROUND

The disclosed embodiments relate to semiconductor devices and methods of forming the same.

Semiconductor devices are widely used in an electronic industry because of their small size, multi-function, and/or low manufacture costs. The semiconductor devices have been highly integrated with the development of the electronic industry. Widths and spaces of patterns of the semiconductor devices are being reduced for the high integration of the semiconductor devices. However, new exposure techniques and/or very expensive exposure techniques are required for fineness of the patterns such that it is difficult to highly integrate the semiconductor devices. Thus, various research has been conducted for new integration techniques. Air spacers may be used in certain semiconductor devices to serve as an insulation pattern. When finely patterned air spacers are used, the air spacers may be inadvertently filled with conductive material during the manufacturing process, which may lead to short circuits and failed devices.

In one embodiment, a semiconductor device is provided. The semiconductor device includes: a substrate; a plurality of bit line structures formed on the substrate, each bit line structure extending in a first direction, a plurality of word lines, each word line extending in a second direction different from the first direction; and a plurality of contact structures, each provided between two adjacent bit line structures of the plurality of bit line structures. Each bit line structure includes a first semiconductor layer, a conductive layer on the first semiconductor layer, and a capping layer on the conductive layer, wherein the conductive layer is disposed above the first semiconductor layer and below the capping layer. Each contact structure includes a lower contact portion and an upper contact portion, wherein a bottom surface of the upper contact portion contacts a top surface of the lower contact portion at a contact structure interface. The semiconductor device further includes a plurality of spacer structures, each spacer structure located between a bit line structure and a contact structure and including at least an air gap, an insulating spacer between the air gap and the contact structure, and a capping spacer. Each capping spacer covers a top of a corresponding air gap, extends between a bit line structure and a contact structure from above the top of the corresponding air gap to a first height below the top of the corresponding air gap, and fills an area between the insulating spacer and the contact structure, wherein the first height is lower than a top of the conductive layer of a bit line structure adjacent to the capping spacer.

In one embodiment, the contact structure interface for each contact structure is located at a second height lower than the first height.

In certain embodiments, a first dopant region is disposed below a first bit line structure of the plurality of bit line structures; and a second dopant region is disposed below a first contact structure of the plurality of contact structures. The first dopant region may contact a first semiconductor layer of the first bit line structure; and the second dopant region may contact the first contact structure.

In one embodiment, for each capping spacer, the capping spacer fills an area between a corresponding insulating spacer and a corresponding bit line structure to a height above the first height and below a top of the corresponding insulating spacer.

SUMMARY

Embodiments disclosed herein may provide semiconductor devices with improved electrical characteristics and methods of forming the same.

Embodiments disclosed herein may also provide semiconductor devices with improved integration and methods of forming the same.

In one aspect, a semiconductor device includes: gate structures on a substrate; first dopant regions and second dopant regions disposed at both sides of the gate structures; conductive lines crossing the gate structures and connected to the first dopant regions, each of the conductive lines including a conductive pattern and a capping pattern on the conductive pattern; and contact structures provided between the conductive lines and connected to the second dopant regions. Each of the contact structures may include a lower contact pattern on a respective second dopant region and an upper contact pattern on the lower contact pattern; and a bottom surface of the upper contact pattern may be lower than a top surface of the conductive pattern.

In some embodiments, the semiconductor device further includes: spacer structures between the conductive lines and the contact structures. Each of the spacer structures may include an air gap and an insulating spacer between the air gap and an adjacent contact structures.

In some embodiments, the bottom surface of the upper contact pattern may be lower than a top surface of the air gap and a top surface of the insulating spacer.

In some embodiments, the semiconductor device may further include: a capping spacer covering the air gap and the insulating spacer. A bottom surface of the capping spacer may be in contact with a top surface of the lower contact pattern.

In some embodiments, the bottom surface of the upper contact pattern may be lower than an interface between the capping spacer and the lower contact pattern.

In some embodiments, the lower contact pattern may include a semiconductor; and the upper contact pattern may include a metal.

In some embodiments, a lower portion of the upper contact pattern may be disposed within an upper portion of the lower contact pattern.

In some embodiments, the semiconductor device may further include: fence patterns provided on the gate structures and extending along the gate structures. The contact structures may be provided in contact holes defined by the conductive lines and the fence patterns.

In some embodiments, the semiconductor device may further include: capacitors on the contact structures.

In another aspect, a method of forming a semiconductor device includes: forming gate structures at a substrate; forming conductive lines crossing the gate structures, each of the conductive lines including a conductive pattern; forming fence patterns on the gate structures, the fence patterns extending along the gate structures; forming preliminary lower contact patterns in first contact holes defined by the conductive lines and the fence patterns; etching the preliminary lower contact patterns to form second contact holes having bottom surfaces lower than a top surface of the conductive pattern; and forming upper contact patterns filling the second contact holes.

In some embodiments, the method further includes: forming a spacer including an air gap on a sidewall of each of the conductive lines; and forming a capping spacer covering the air gap. The air gap may be formed after the formation of the preliminary lower contact patterns and before the formation of the upper contact patterns.

In some embodiments, forming the preliminary lower contact patterns includes: forming a semiconductor layer filling the first contact holes; and removing an upper portion of the semiconductor layer. An upper portion of the spacer may be removed along with the upper portion of the semiconductor layer.

In some embodiments, forming the second contact holes includes: selectively etching upper portions of the preliminary lower contact patterns before the formation of the capping spacer.

In some embodiments, forming the second contact holes includes: isotropically etching upper portions of the preliminary lower contact patterns after the formation of the capping spacer.

In some embodiments, forming the spacer including the air gap includes: sequentially forming a first spacer, a second spacer, and a third spacer on the sidewall of each of the conductive lines; and selectively removing the second spacer.

BRIEF DESCRIPTION OF THE DRAWINGS

The various disclosed embodiments will become more apparent in view of the attached drawings and accompanying detailed description.

FIGS. 2A to 17A are cross-sectional views taken along a line A-A' of FIG. 1 to illustrate a method of forming a semiconductor device according to some exemplary embodiments;

FIGS. 2B to 17B are cross-sectional views taken along a line B-B' of FIG. 1 to illustrate a method of forming a semiconductor device according to some exemplary embodiments;

FIGS. 18A to 20A are cross-sectional views taken along a line A-A' of FIG. 1 to illustrate a method of forming a semiconductor device according to other exemplary embodiments;

FIGS. 18B to 20B are cross-sectional views taken along a line B-B' of FIG. 1 to illustrate a method of forming a semiconductor device according to other exemplary embodiments;

DETAILED DESCRIPTION

Figure 1:
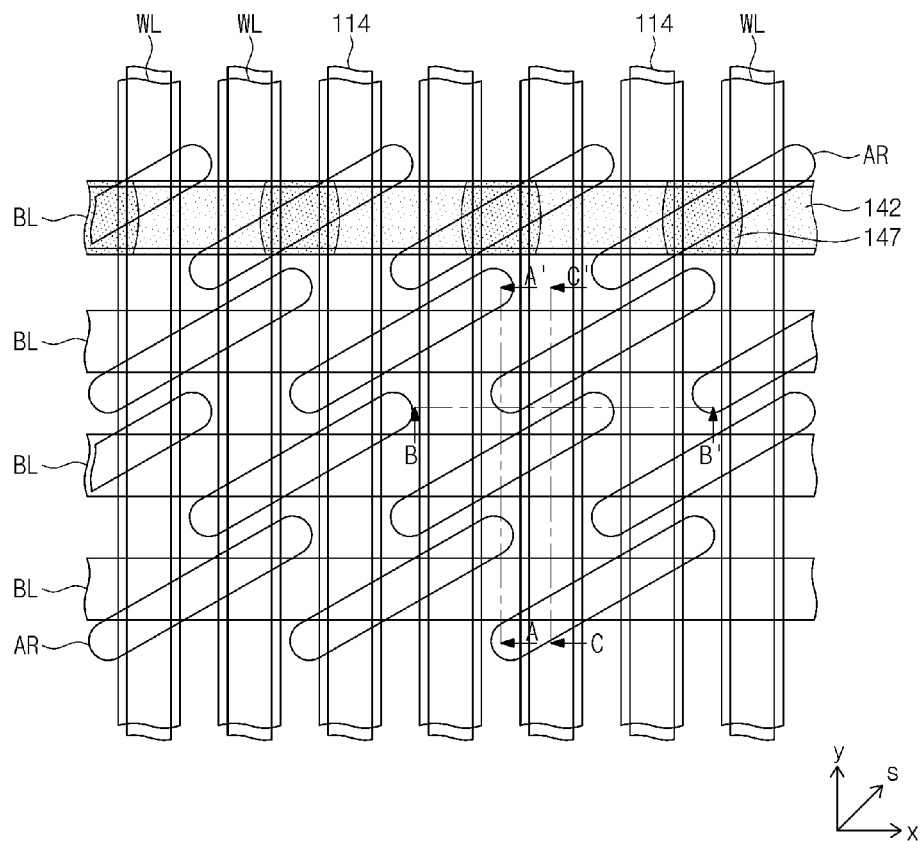
FIG. 1 is a plan view illustrating a semiconductor device according to example embodiments.

The disclosure will now be described more fully hereinafter with reference to the accompanying drawings, in which exemplary embodiments are shown. The advantages and features disclosed herein and methods of achieving them will be apparent from the following exemplary embodiments that will be described in more detail with reference to the accompanying drawings. It should be noted, however, that the inventive concept is not limited to the following exemplary embodiments, and may be implemented in various forms. In the drawings, various views and dimensions may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal exemplary views. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limiting the scope of the inventive concept.

It will be also understood that although the terms first, second, third etc. may be used herein to describe various elements, these elements should not be limited by these terms. Unless indicated otherwise, these terms are only used to distinguish one element from another element. Thus, a first element in some embodiments could be termed a second element in other embodiments without departing from the teachings of the present invention. Exemplary embodiments of aspects of the present disclosure explained and illustrated herein include their complementary counterparts. The same reference numerals or the same reference designators denote the same or similar elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit the scope of example embodiments.

FIG. 1 is a plan view illustrating a semiconductor device according to example embodiments. FIGS. 2A to 17A are cross-sectional views taken along a line A-A' of FIG. 1 to illustrate a method of forming a semiconductor device according to some embodiments. FIGS. 2B to 17B are cross-sectional views taken along a line B-B' of FIG. 1 to illustrate a method of forming a semiconductor device according to some embodiments.

Figure 2A:
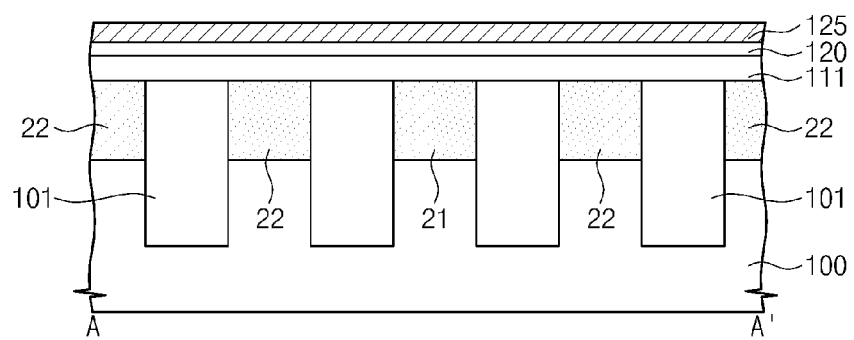
Figure 2B:
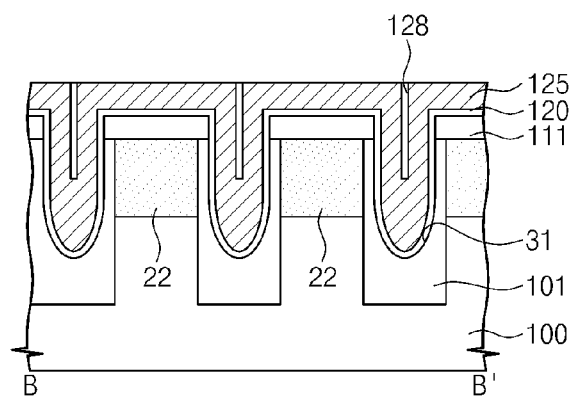

Referring to FIGS. 1, 2A, and 2B, a device isolation layer 101 may be formed in a substrate 100 to define active regions AR. For example, the substrate 100 may be a semiconductor substrate including silicon, germanium, or silicon-germanium. The active regions AR may have bar-shapes laterally spaced apart from each other in a plan view. A first direction and a second direction may cross each other in a plan view. Each of the active regions AR may extend in a third direction (hereinafter, referred to as 'an s-direction') non-perpendicular to either of the first direction (hereinafter, referred to as 'an x-direction') or the second direction (hereinafter, referred to as 'a y-direction') in a plan view.

Dopant regions 21 and 22 may be formed in upper portions of the active regions AR. In one embodiment, the dopant regions 21 and 22 may be formed by implanting dopant ions of a different conductivity type from the substrate 100 into the upper portions of the active regions AR. The dopant regions 21 and 22 may be formed after or before the formation of the device isolation layer 101. In other embodiments, the dopant regions 21 and 22 may be formed in a subsequent step.

Trenches 31 may be formed in an upper portion of the substrate 100. In one embodiment, the trenches 31 may extend in the y-direction and may be spaced apart from each other in the x-direction. In each of the active regions AR, a first dopant region 21 may be provided between a pair of second dopant regions 22. The first dopant region 21 and the second dopant regions 22 may be separated from each other by the trenches 31 in each of the active regions AR.

In one embodiment, after a mask pattern 111 is formed on the substrate 100, a dry etching process and/or a wet etching process may be performed using the mask pattern 111 as an etch mask to form the trenches 31. For example, the mask pattern 111 may include at least one of a silicon nitride layer and a silicon oxynitride layer. A depth of each of the trenches 31 may be less than a depth of the device isolation layer 101.

A first insulating layer 120, a conductive layer 125, and a filling layer 128 may be sequentially formed on the resultant structure having the trenches 31. After the first insulating layer 120 and the conductive layer 125 are formed in the trenches 31, the filling layer 128 may be formed to fill the trenches 31. The formation process of the filling layer 128 may include performing a planarization process after forming a insulating layer on the conductive layer 125.

For example, the first insulating layer 120 may include at least one of a silicon oxide layer, a silicon nitride layer, and a silicon oxynitride layer. The conductive layer 125 may include at least one of a doped semiconductor material, a conductive metal nitride, a metal, and a metal-semiconductor compound. The filling layer 128 may include at least one of a silicon oxide layer, a silicon nitride layer, and a silicon oxynitride layer. Each of the first insulating layer 120, the conductive layer 125 and the filling layer 128 may be formed by at least one of a chemical vapor deposition (CVD) process, a physical vapor deposition (PVD) process, and an atomic layer deposition (ALD) process.

Figure 3A:
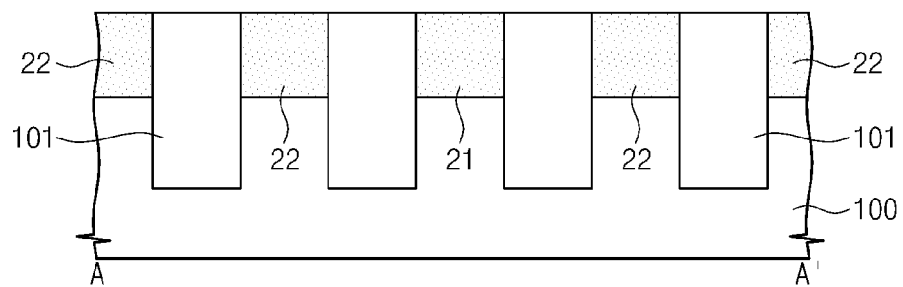
Figure 3B:
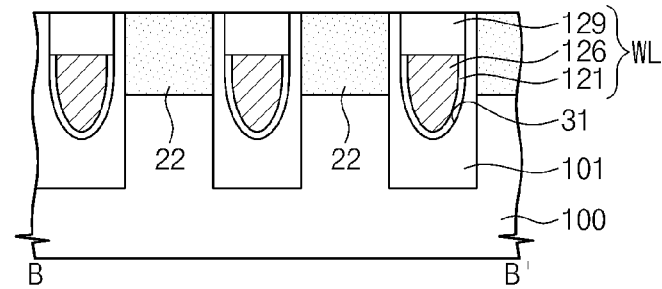

Referring to FIGS. 1, 3A, and 3B, in one embodiment, the first insulating layer 120 and the conductive layer 125 may be etched. By the etching process, the first insulating layer 120 may be divided into gate insulating layers 121 separated from each other and the conductive layer 125 may be divided into gate electrodes 126 separated from each other. The gate insulating layers 121 and the gate electrodes 126 may be confined in the trenches 31. In one embodiment, the etching process is performed until the filling layer 128 is removed. Thus, top surfaces of the gate insulating layers and the gate electrodes 126 may be lower than top ends of the trenches 31.

Gate capping patterns 129 may be formed on the gate electrodes 126, respectively. For example, an insulating layer may be formed after the previous etching step to fill the remaining regions of the trenches 31 having the gate electrodes 126 and then a planarization process may be performed on the insulating layer until a top surface of the substrate 100 is exposed, thereby forming the gate capping patterns 129. The gate capping patterns 129 may include at least one of a silicon nitride layer, a silicon oxide layer, and a silicon oxynitride layer. As a result, gate structures may be formed in the trenches 31, respectively. The gate structures may be, for example, word lines WL of a semiconductor device.

Figure 4A:
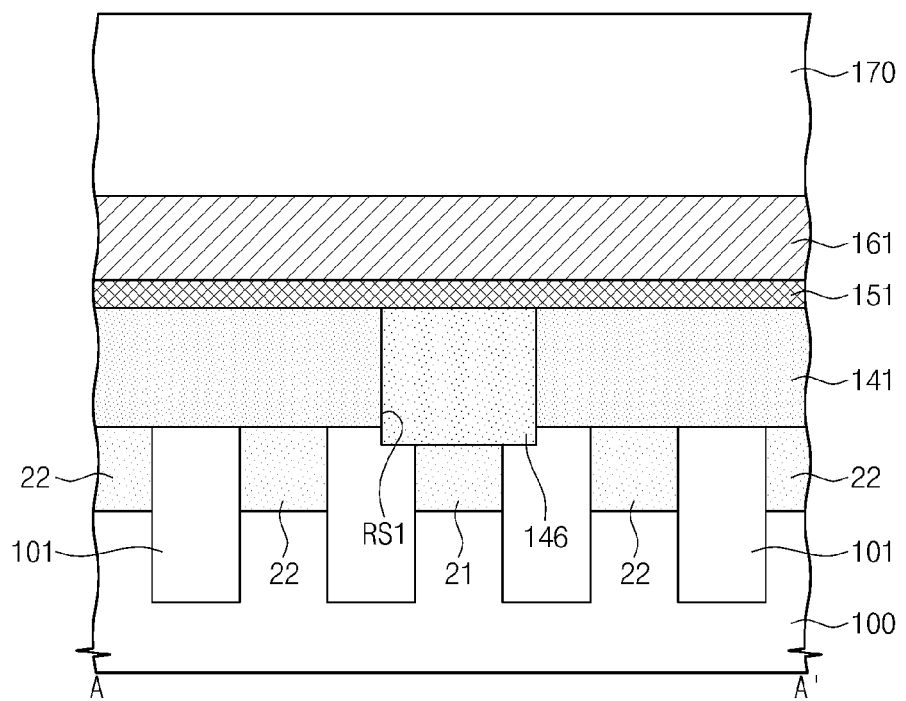
Figure 4B:
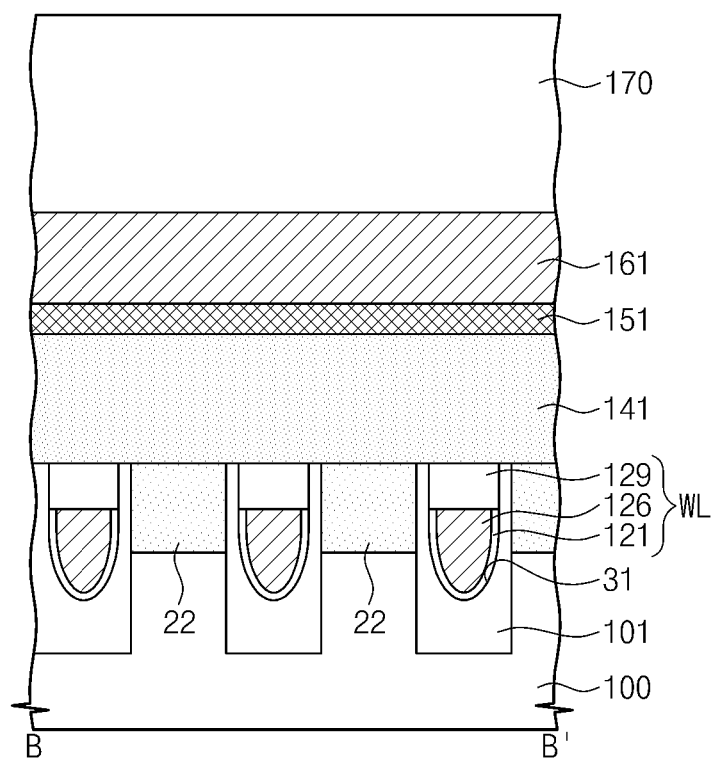

Referring to FIGS. 1, 4A, and 4B, a first semiconductor layer 141 may be formed on the substrate 100. In some embodiments, the first semiconductor layer 141 may include an undoped poly-silicon. First recess regions RS1 may be formed to penetrate the first semiconductor layer 141. The first recess regions RS1 may expose the first dopant regions 21, respectively, and form a first semiconductor pattern from first semiconductor layer 141. In some embodiments, each of the first recess regions RS1 may have a circular shape or an elliptical shape in a plan view. A mask pattern may be formed on the first semiconductor layer 141 and then a dry etching process and/or a wet etching process may be performed using the mask pattern as an etch mask to form the first recess regions RS1. Bottom surfaces of the first recess regions RS1 may be lower than a bottom surface of the first semiconductor layer 141 by over-etching.

Second semiconductor patterns 146 may be formed to fill the first recess regions RS1, respectively. For example, the second semiconductor patterns 146 may include a doped poly-silicon. In some embodiments, a semiconductor layer may be formed to fill the first recess regions RS1 and then a planarization process may be performed on the semiconductor layer to form the second semiconductor patterns 146.

A barrier layer 151, a metal layer 161, and a capping layer 170 may sequentially be formed on the first semiconductor layer 141. The barrier layer 151 may include a metal-silicide layer and/or a metal-nitride layer on the metal silicide layer. In some embodiments, the metal-silicide layer may include at least one of tungsten silicide (WSi), tantalum silicide (TaSi), and titanium silicide (TiSi). The metal-nitride layer may include at least one of tungsten nitride (WN), tantalum nitride (TaN), and titanium nitride (TiN).

The metal layer 161 may include at least one of tungsten (W), titanium (Ti), and tantalum (Ta). The capping layer 170 may include at least one of a silicon oxide layer, a silicon nitride layer, and a silicon oxynitride layer. Each of the barrier layer 151, the metal layer 161 and the capping layer 170 may be formed, for example, by a sputtering process or a CVD process.

Figure 5A:
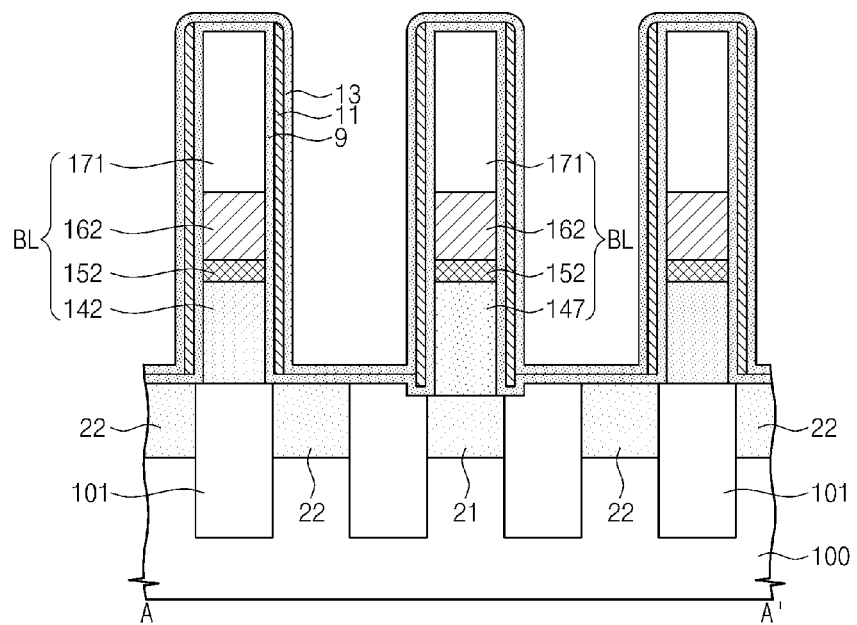
Figure 5B:
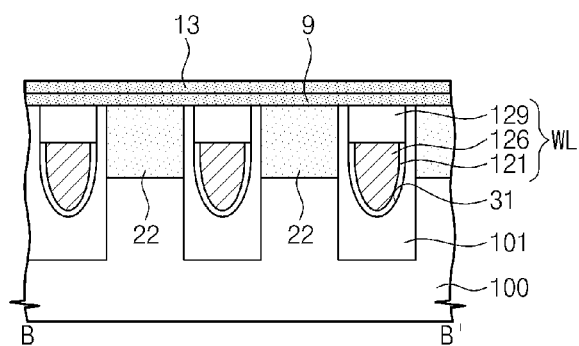

Referring to FIGS. 1, 5A, and 5B, the first semiconductor layer 141, the second semiconductor pattern 146, the barrier layer 151, the metal layer 161 and the capping layer 170 may be patterned to form conductive lines in the cell array region CAR of the substrate 100. The conductive lines may be bit lines BL of the semiconductor device. Each of the bit lines BL may include a plurality of first conductive patterns 147, a barrier pattern 152, a second conductive pattern 162, and a capping pattern 171. Each first conductive pattern 147, barrier pattern 152, second conductive pattern 162, and capping pattern 171 may be referred to herein as a bit line structure. The plurality of first conductive patterns 147 may be respectively connected to the first dopant regions 21 arranged in an extending direction of the bit line BL. The barrier pattern 152, the second conductive pattern 162, and the capping patterns 171 may be sequentially stacked on the plurality of first conductive patterns 147 in each of the bit lines BL. The first semiconductor layer 141 may be divided into first semiconductor patterns 142 by the patterning process. In each of the bit lines BL, the first semiconductor patterns 142 may be separated from each other with the first conductive patterns 147 therebetween. As such, the first conductive patterns 147 and the first semiconductor patterns 142 may be alternately arranged along the extending direction (e.g., the x-direction) of the bit line BL under the barrier pattern 152 in each of the bit lines BL.

A first spacer layer 9 may be formed to cover sidewalls and top surfaces of the bit lines BL. A second spacer 11 may be formed on the first spacer layer 9. In some embodiments, an insulating layer may be conformally formed on the resultant structure having the first spacer layer 9 and then the insulating layer may be anisotropically etched to form the second spacer 11.

In one embodiment, a third spacer layer 13 may be formed on the second spacer 11. The third spacer layer 13 may be formed, for example, by conformally depositing an insulating layer on the resultant structure having the second spacer 11.

The first spacer layer 9 and the third spacer layer 13 may be formed of a material having an etch selectivity with respect to the second spacer 11. For example, in one embodiment, the first and third spacer layers 9 and 13 may include silicon nitride and the second spacer 11 may include silicon oxide.

Figure 6A:
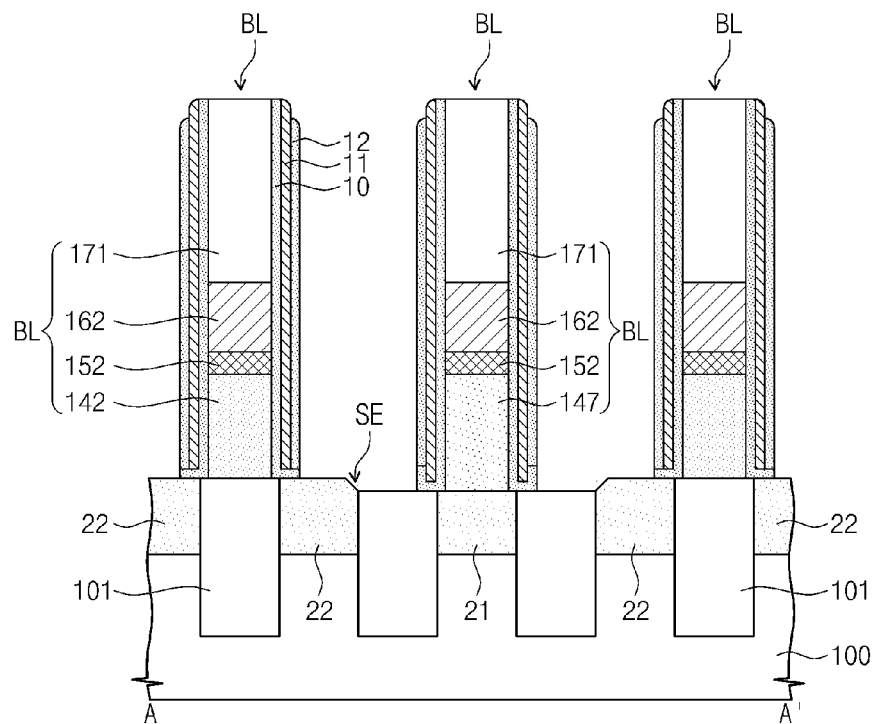
Figure 6B:
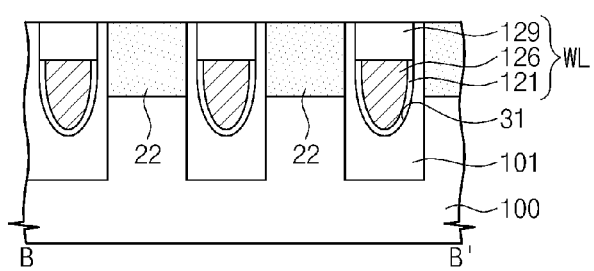

Referring to FIGS. 1, 6A, and 6B, an anisotropic etching process may be performed to form a first spacer 10 and a third spacer 12. The first spacer 10 may be formed from the first spacer layer 9 and the third spacer 12 may be formed from the third spacer layer 13. The first to third spacers 10, 11, and 12 may expose the capping pattern 171. The first to third spacers 10, 11, and 12 may be confined on each sidewall of each of the bit lines BL and may expose the second dopant regions 22. A step SE may be formed between the second dopant region 22 and the device isolation layer 101 which are exposed by the anisotropic etching process. The step SE may be caused by positions of the bottom surfaces of the first recess regions RS1 described with reference to FIGS. 4A and 4B. The step SE may be inclined. For example, the step SE may not be perpendicular to the top surface of the substrate 100.

Figure 7A:
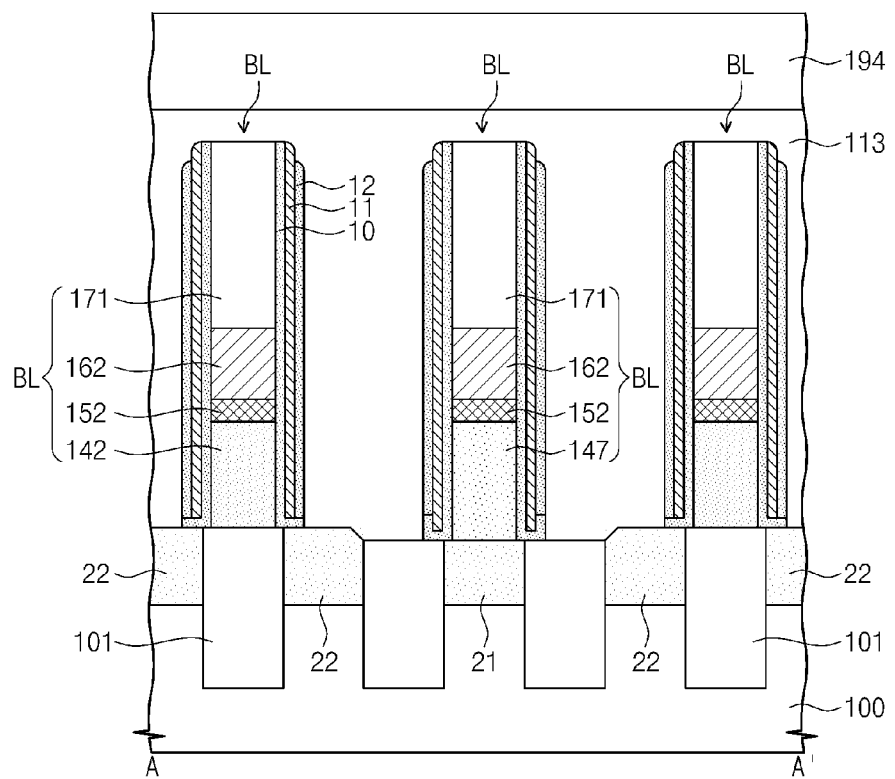
Figure 7B:
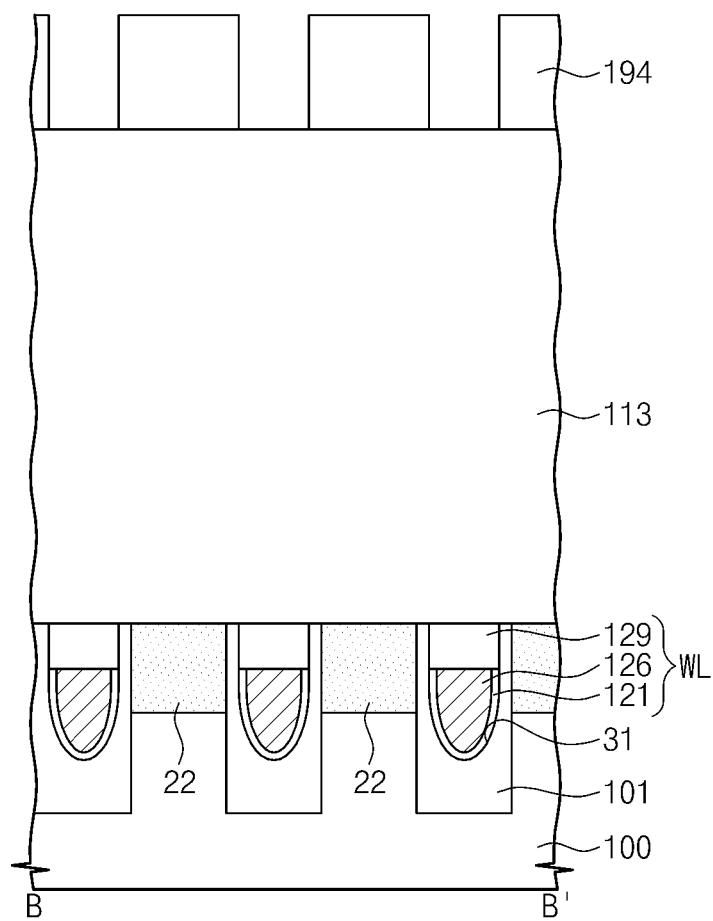
Figure 7C:
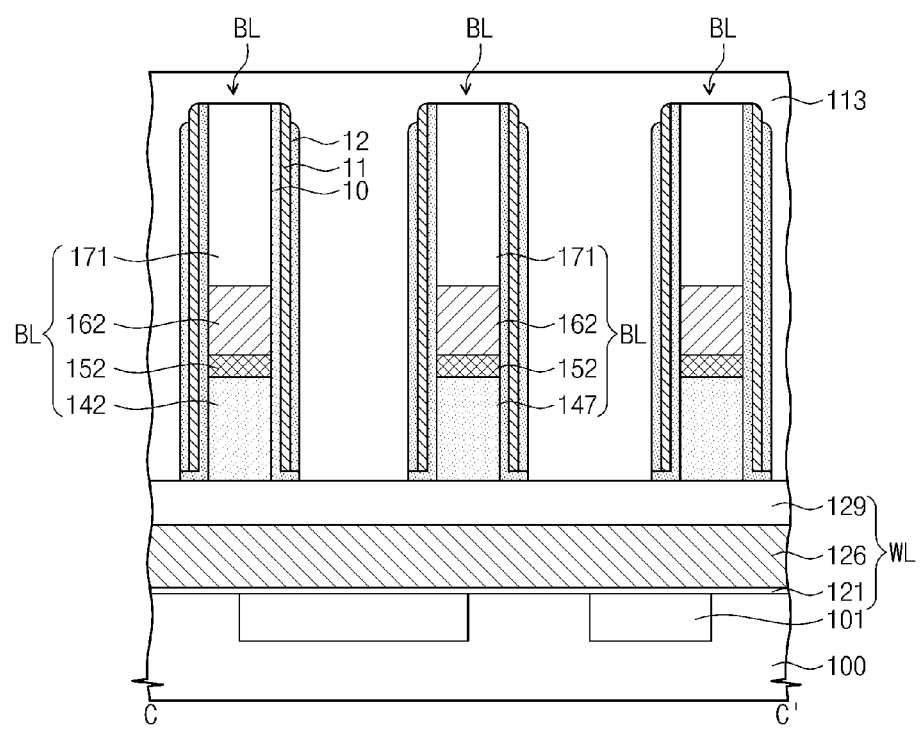
FIGS. 7C, 8C, 9C, and 10C are cross-sectional views taken along a line C-C' of FIG. 1 to illustrate a method of forming a semiconductor device according to some exemplary embodiments.

Referring to FIGS. 1, 7A, 7B, and 7C, a mold layer 113 may be formed to cover the bit lines BL. FIG. 7C is a cross-sectional view taken along a line C-C' of FIG. 1. For example, the mold layer 113 may include silicon oxide or silicon oxynitride. The formation process of the mold layer 113 may include a planarization process.

A mask pattern 194 may be formed on the mold layer 113. The mask pattern 194 may include linear portions extending in the y-direction and spaced apart from each other in the x-direction. In certain embodiments, the mask pattern 194 may include silicon nitride or silicon oxynitride.

Figure 8A:
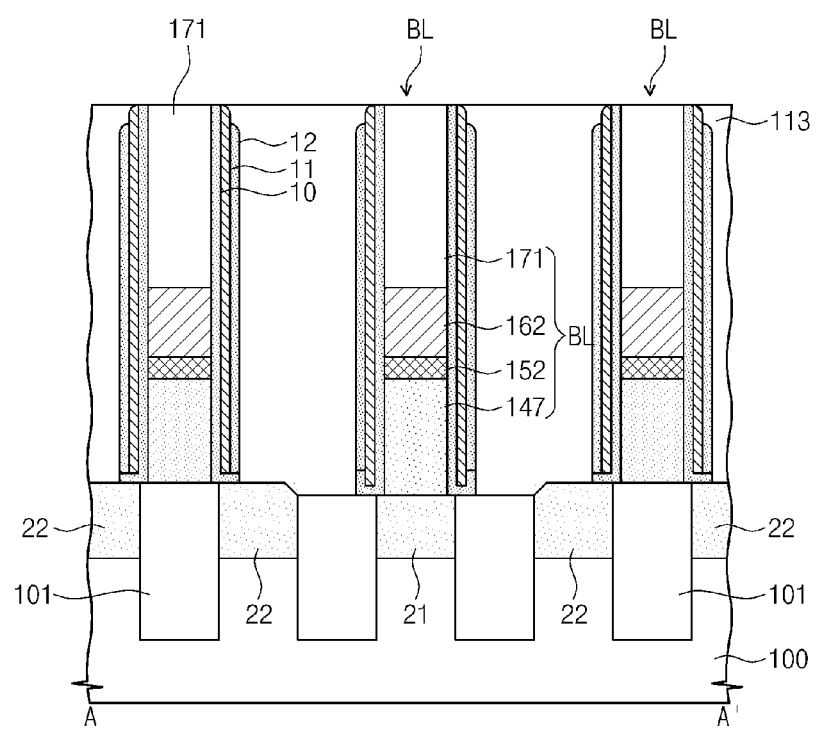
Figure 8B:
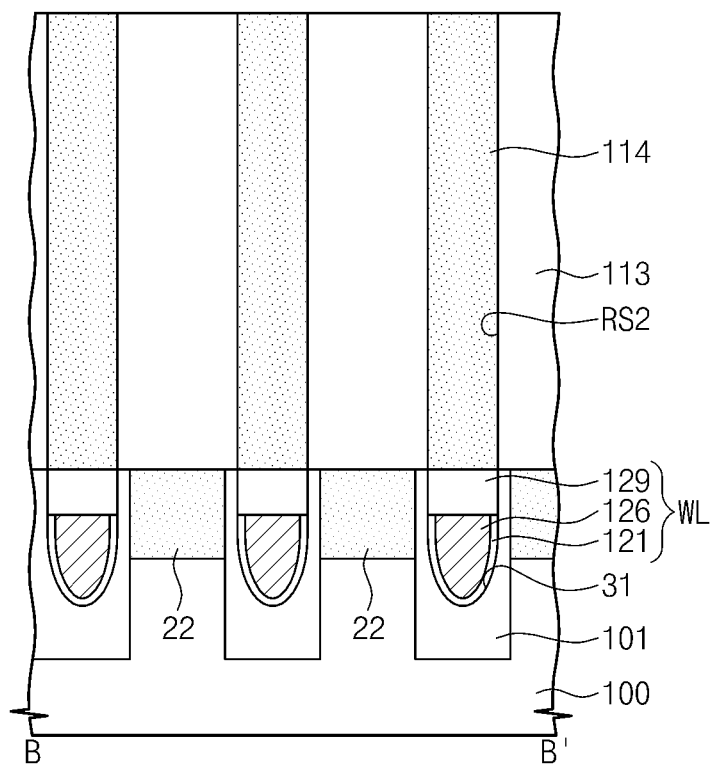
Figure 8C:
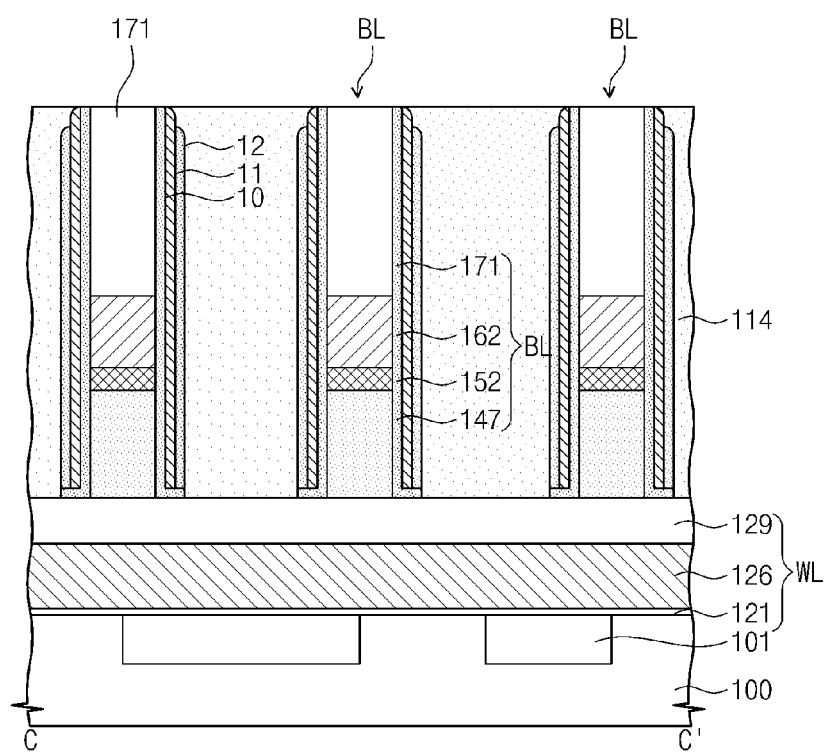

Referring to FIGS. 1, 8A, 8B, and 8C, an etching process of the mold layer 113 may be performed using the mask pattern 194 as an etch mask. FIG. 8C is a cross-sectional view taken along the line C-C' of FIG. 1. As a result, second recess regions RS2 may be formed to penetrate the mold layer 113. The second recess regions RS2 may expose the gate capping patterns 129.

Fence patterns 114 may be formed in the second recess regions RS2, respectively. The fence patterns 114 may be formed of a material having an etch selectivity with respect to the mold layer 113. For example, the fence patterns 114 may include silicon oxynitride or silicon nitride. In some embodiments, after an insulating layer is formed to fill the second recess regions RS2, a planarization process may be performed on the insulating layer to form the fence patterns 114. The planarization process may be performed until the capping patterns 171 are exposed. The fence patterns 114 may extend along the word lines WL in the y-direction and may cross the bit lines BL. Fence patterns 114 may also be referred to herein as parallel bar-shaped patterns, based on their cross-section appearance such as shown in FIG. 8B.

Figure 9A:
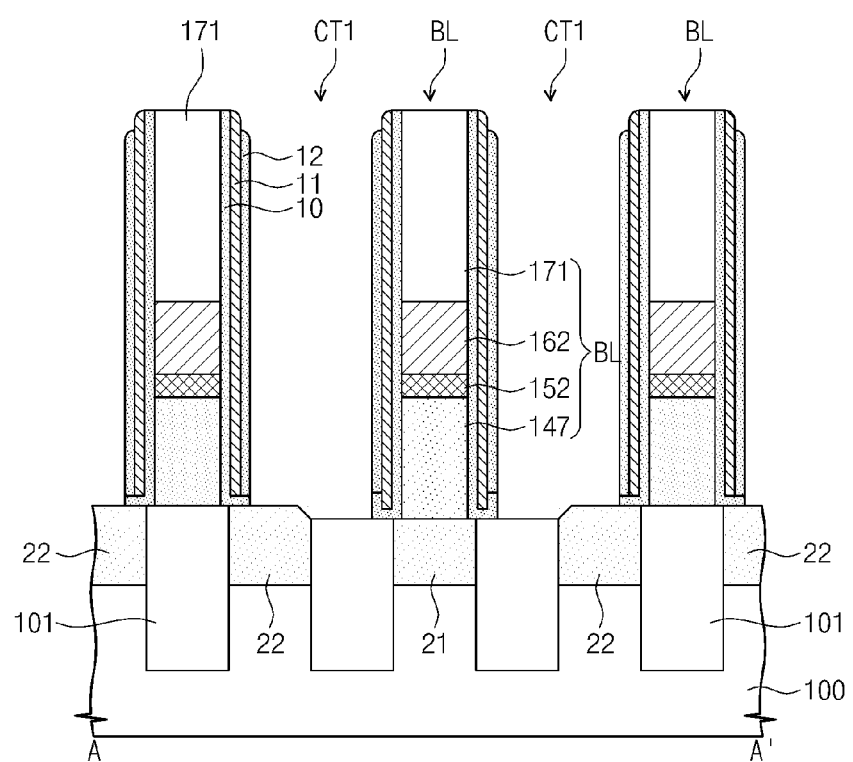
Figure 9B:
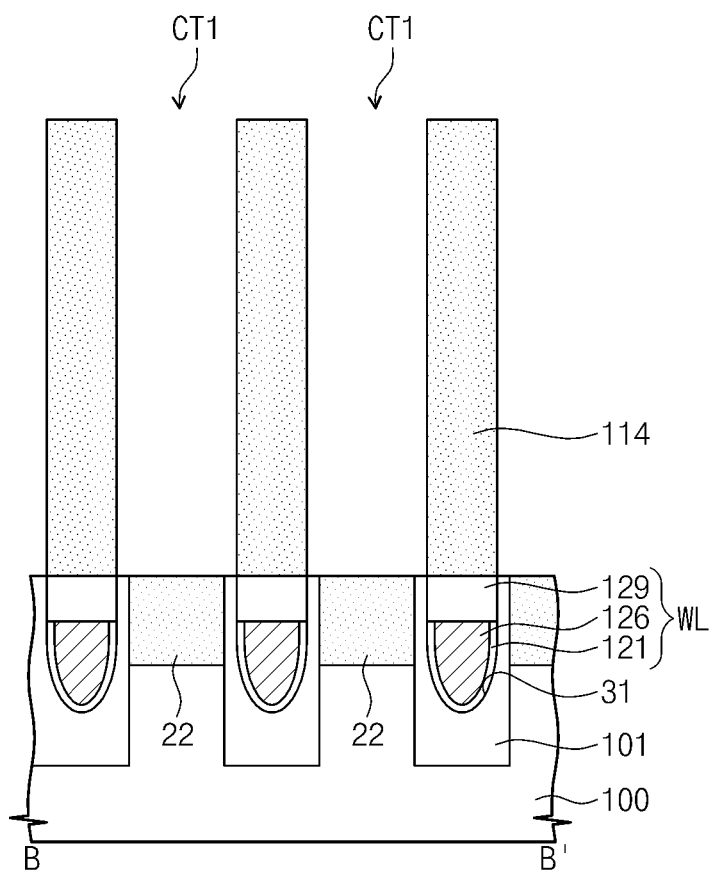
Figure 9C:
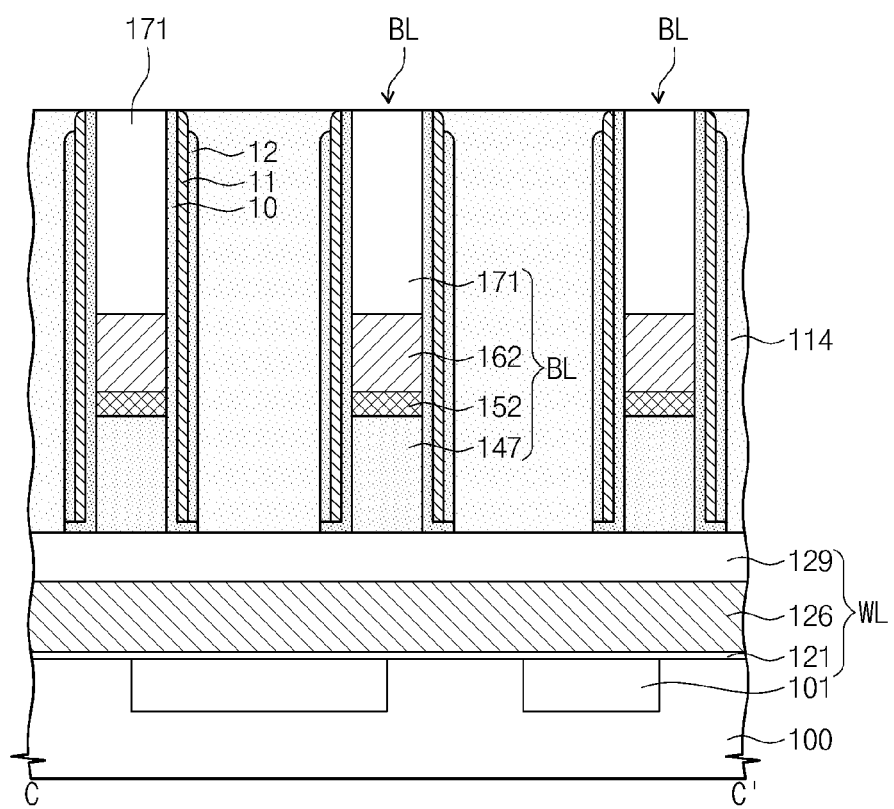

Referring to FIGS. 1, 9A, 9B, and 9C, the mold layer 113 may be removed to form first contact holes CT1. As such, mold layer 113 may also be referred to as a temporary mold layer. FIG. 9C is a cross-sectional view taken along the line C-C' of FIG. 1. The removal process of the mold layer 113 may include, for example, a dry etching process and/or a wet etching process. The first contact holes CT may be regions defined by the bit lines extending in the x-direction and the fence patterns 114 extending in the y-direction.

Figure 10A:
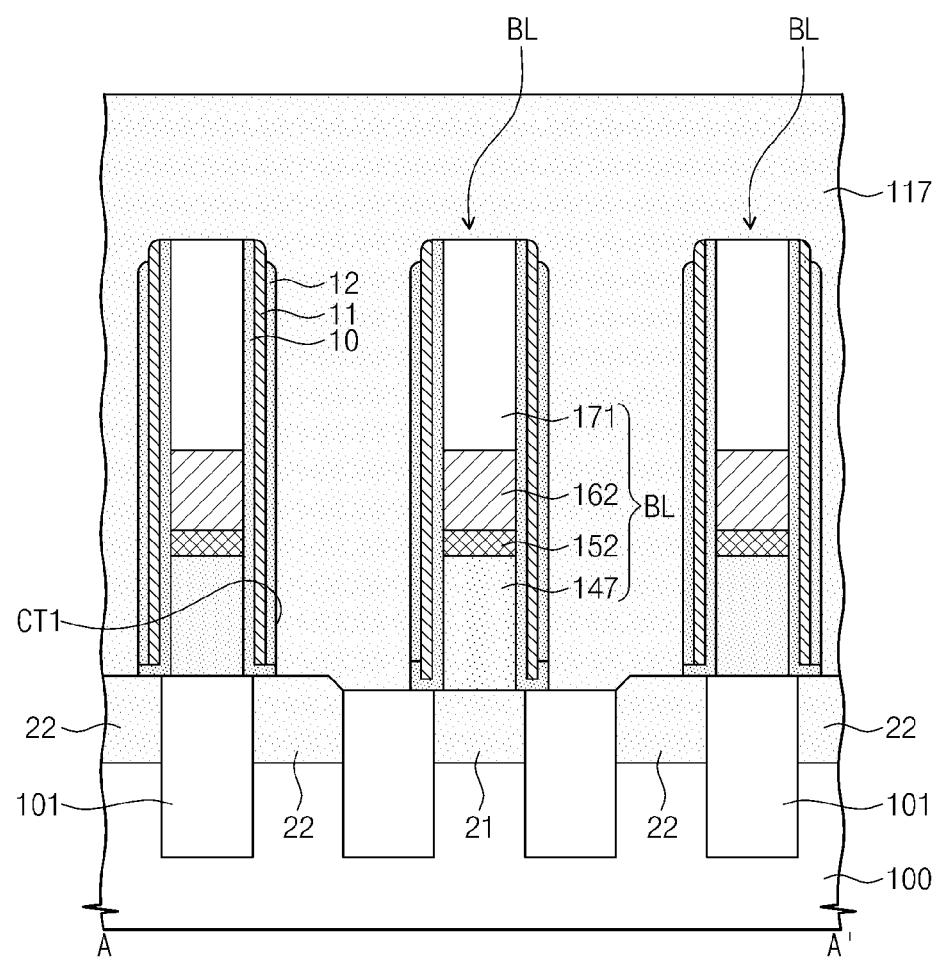
Figure 10B:
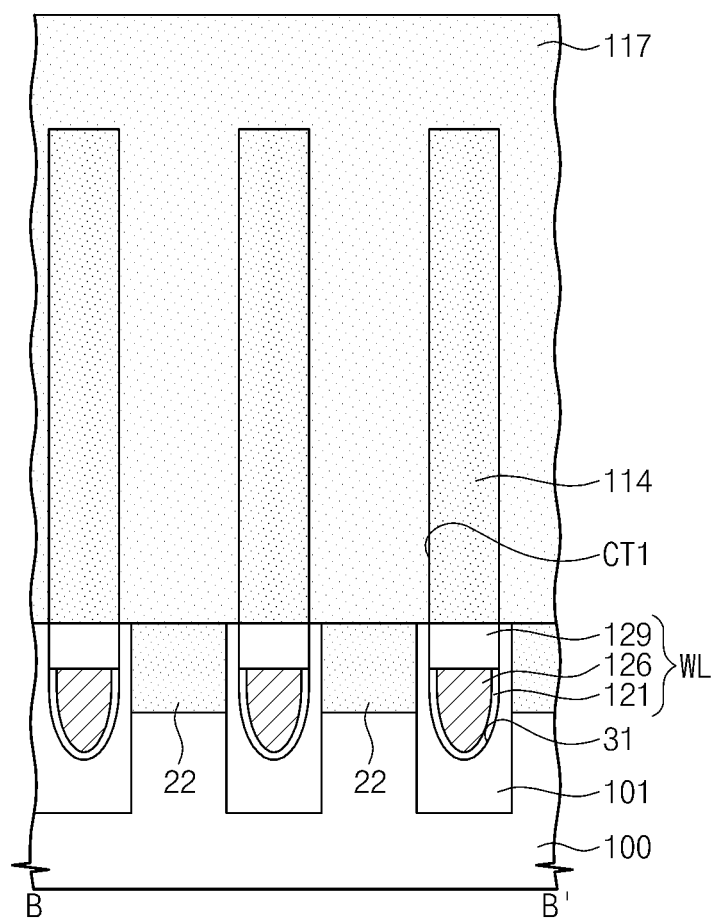
Figure 10C:
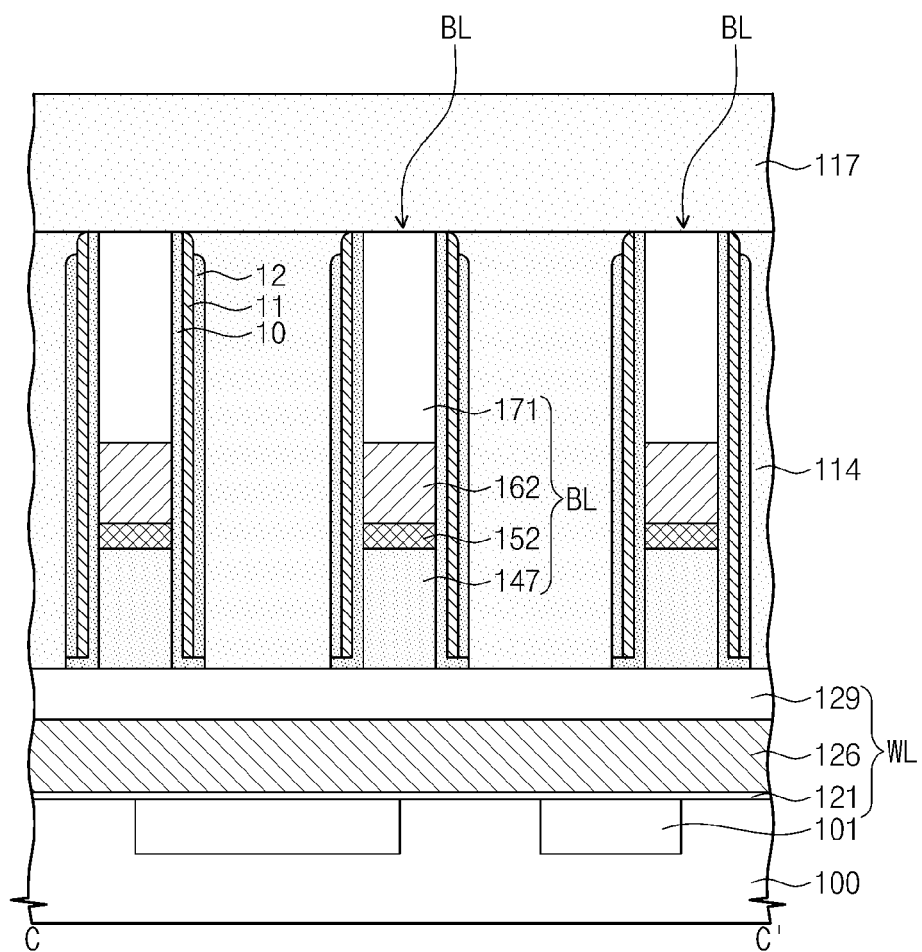

Referring to FIGS. 1, 10A, 10B, and 10C, a semiconductor layer 117 may be formed to fill the first contact holes CT1. FIG. 10C is a cross-sectional view taken along the line C-C' of FIG. 1. For example, the semiconductor layer 117 may be a doped poly-silicon layer. The semiconductor layer 117 may be formed by a CVD process.

Figure 11A:
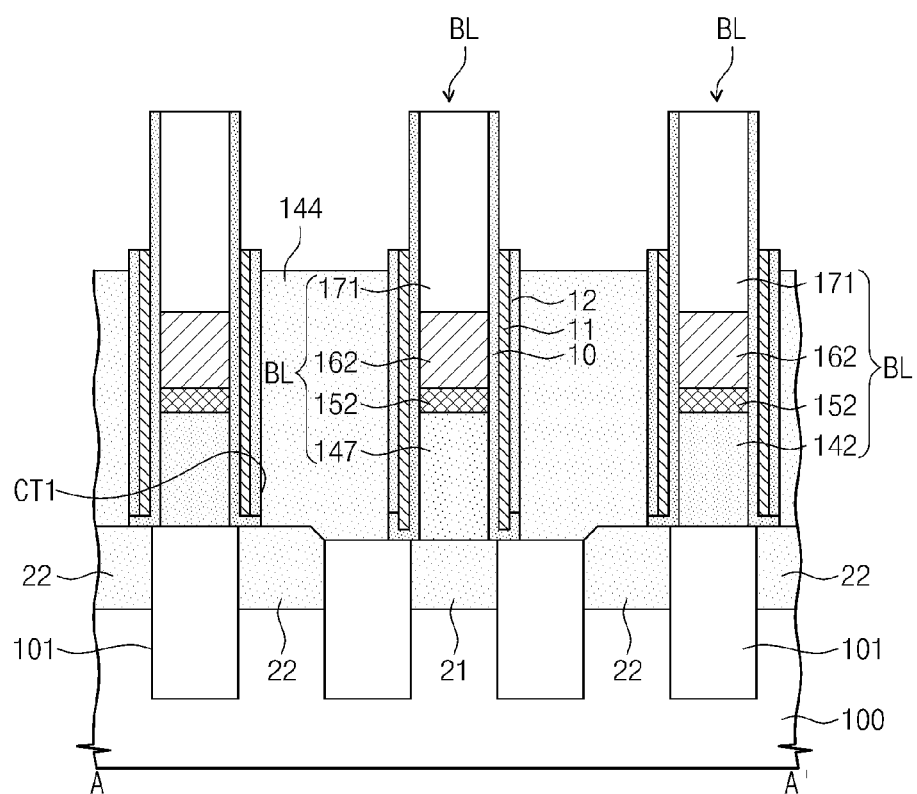
Figure 11B:
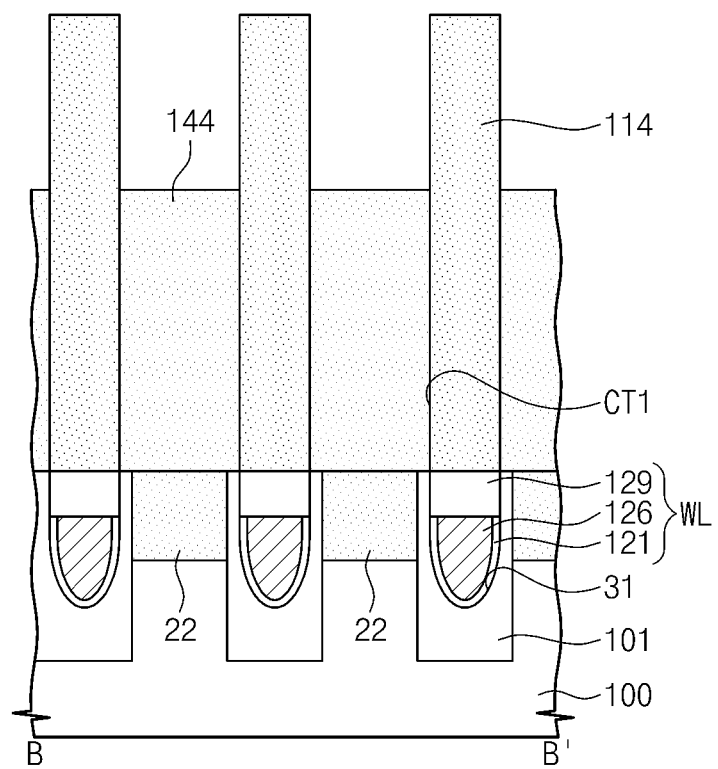

Referring to FIGS. 1, 11A, and 11B, an upper portion of the semiconductor layer 117 may be removed to form preliminary lower contact patterns 144. In some embodiments, the removal process of the upper portion of the semiconductor layer 117 may include a wet etching process. Top surfaces of the preliminary lower contact patterns 144 may be higher than a top surface of the second conductive pattern 162. Upper portions of the first to third spacers 10, 11, and 12 may be removed along with the upper portion of the semiconductor layer 117. Thus, a top surface of the second spacer 11 may be exposed. In some embodiments, a height difference may occur between the top surface of the preliminary lower contact pattern 144 and the top surfaces of the first to third spacers 10, 11, and 12, as illustrated in FIG. 11A. However, the inventive concept is not limited thereto. In other embodiments, the top surfaces of the first to third spacers 10, 11, and 12 may be substantially coplanar with the top surface of the preliminary lower contact pattern 144.

Figure 12A:
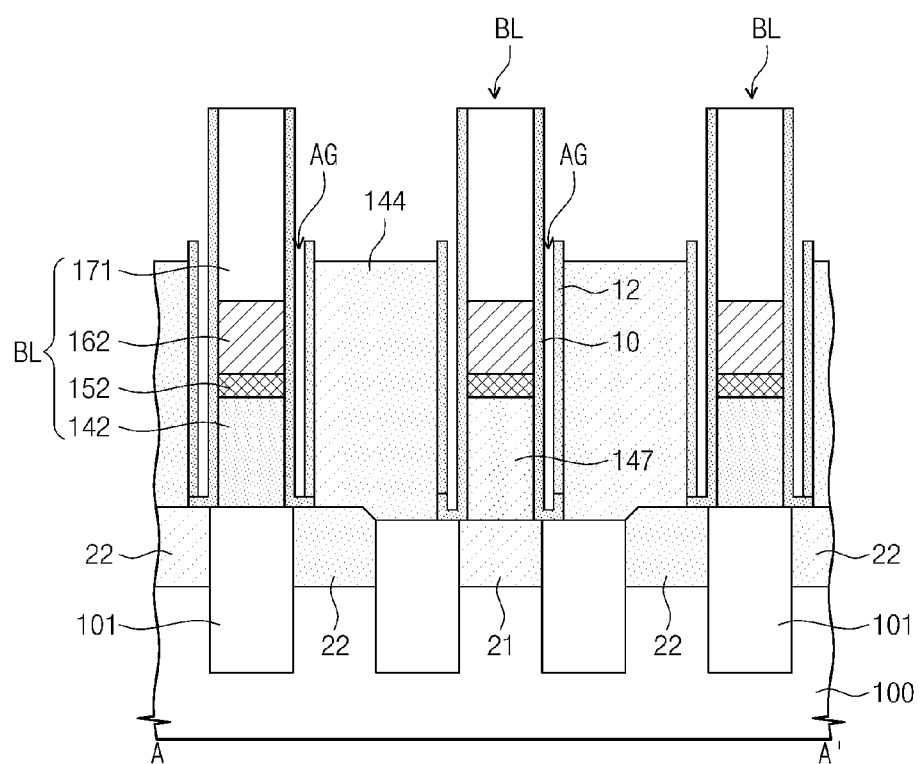
Figure 12B:
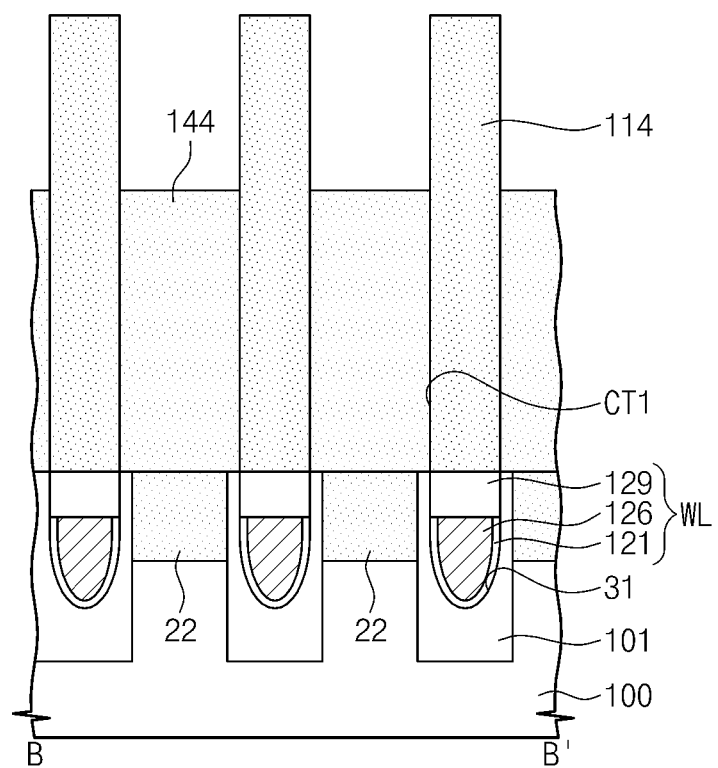

Referring to FIGS. 1, 12A, and 12B, the exposed second spacer 11 may be selectively removed. The selective removal process of the second spacer 11 may include, for example, a wet etching process. An air gap AG may be formed between the first spacer 10 and the third spacer 12 by the removal of the second spacer 11. The air gap AG may be a substantially empty space in which a solid phase material is not provided.

Figure 13A:
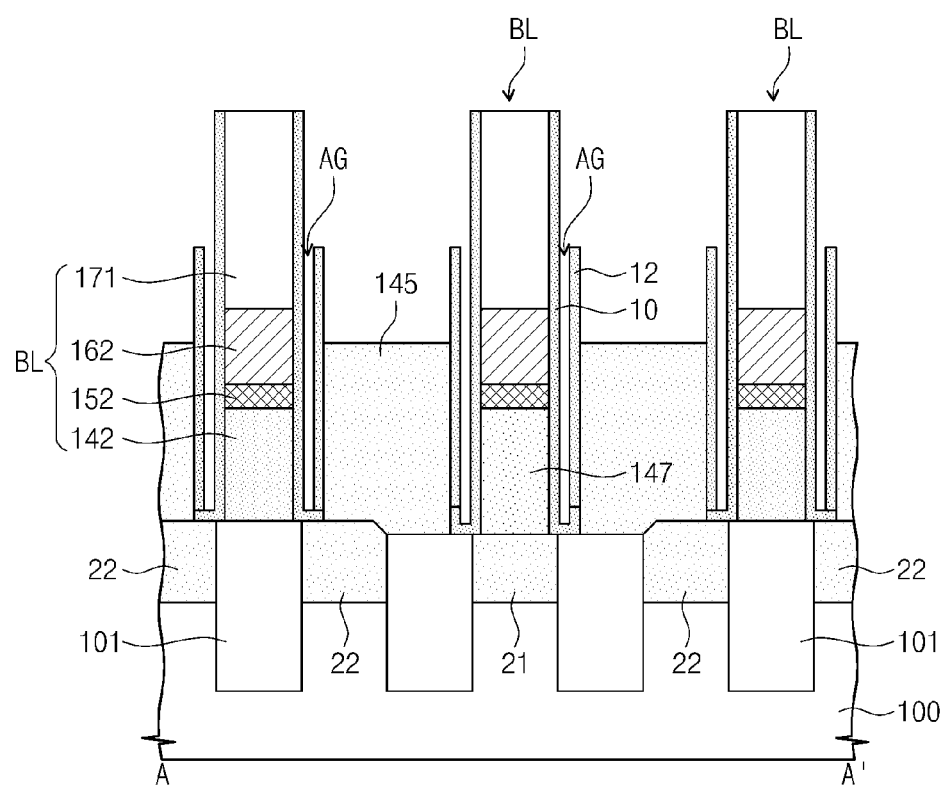
Figure 13B:
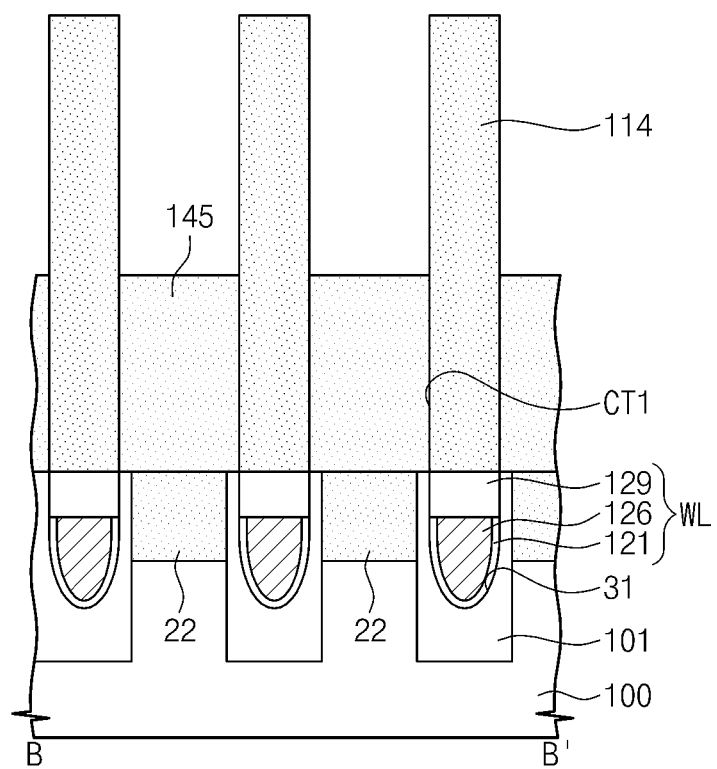

Referring to FIGS. 1, 13A, and 13B, upper portions of the preliminary lower contact patterns 144 may be removed to form lower contact patterns 145. Top surfaces of the lower contact patterns 145 may be lower than the top surface of the second conductive pattern 162. The formation process of the lower contact patterns 145 may include a selective etching process. In one embodiment, the first and third spacers 10 and 12 are not etched by the selective etching process for the formation of the lower contact patterns 145. As a result, a height difference between the top surface of the lower contact pattern 145 and the top surfaces of the first and third spacers 10 and 12 may further increase.

Figure 14A:
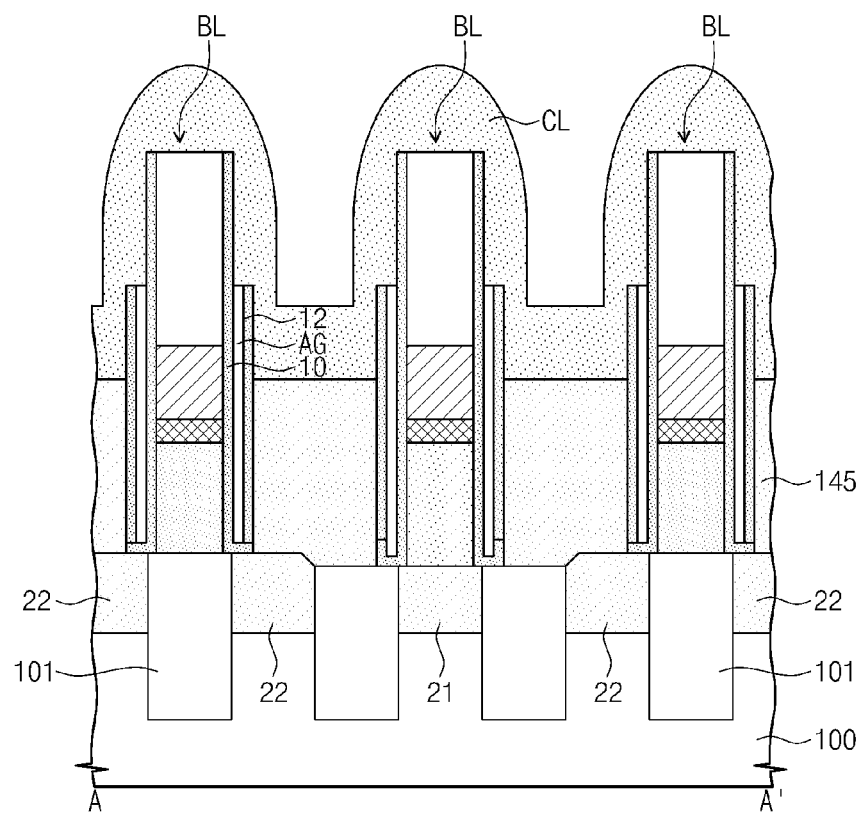
Figure 14B:
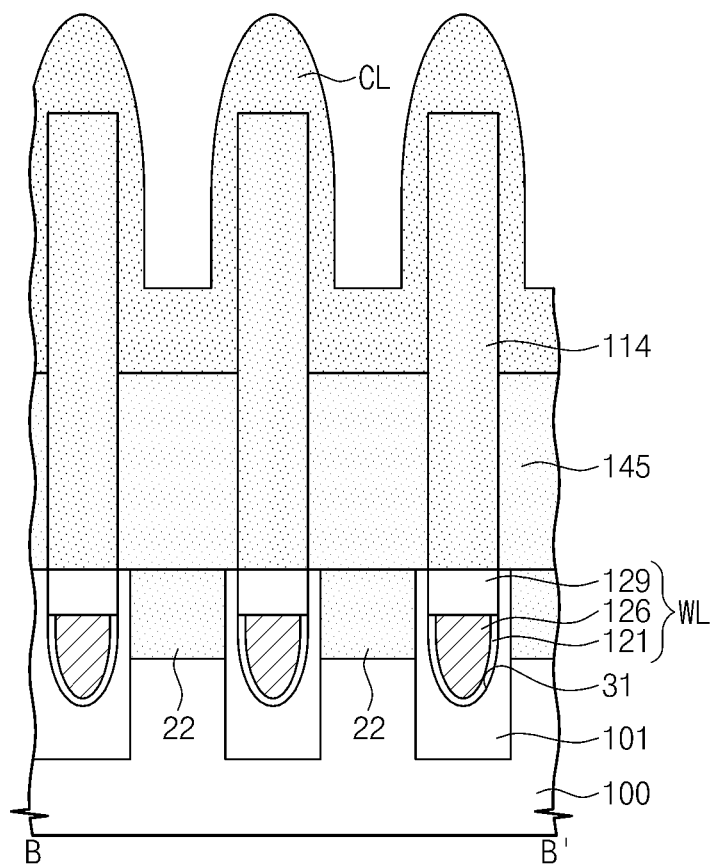

Referring to FIGS. 1, 14A, and 14B, a capping insulating layer CL may be formed to cover the air gap AG. In one embodiment, the capping insulating layer CL may not fill the air gap AG. In some embodiments, the capping insulating layer CL may be formed of a layer having a poor step coverage property. The capping insulating layer CL does not fill the air gap AG in FIG. 14A. Alternatively, the capping insulating layer CL may partially fill the air gap AG. In some embodiments, the capping insulating layer CL may be a silicon nitride layer or a silicon oxynitride layer. A top of the air gap can be considered to have a terminal end at a location where the air gap meets the capping insulating layer CL. As shown in FIG. 14A, the top terminal end of the air gap can be at substantially the same height as the top of the third spacer 12. In other embodiments, the top terminal of the air gap can be at a height below the top of the third spacer 12.

Figure 15A:
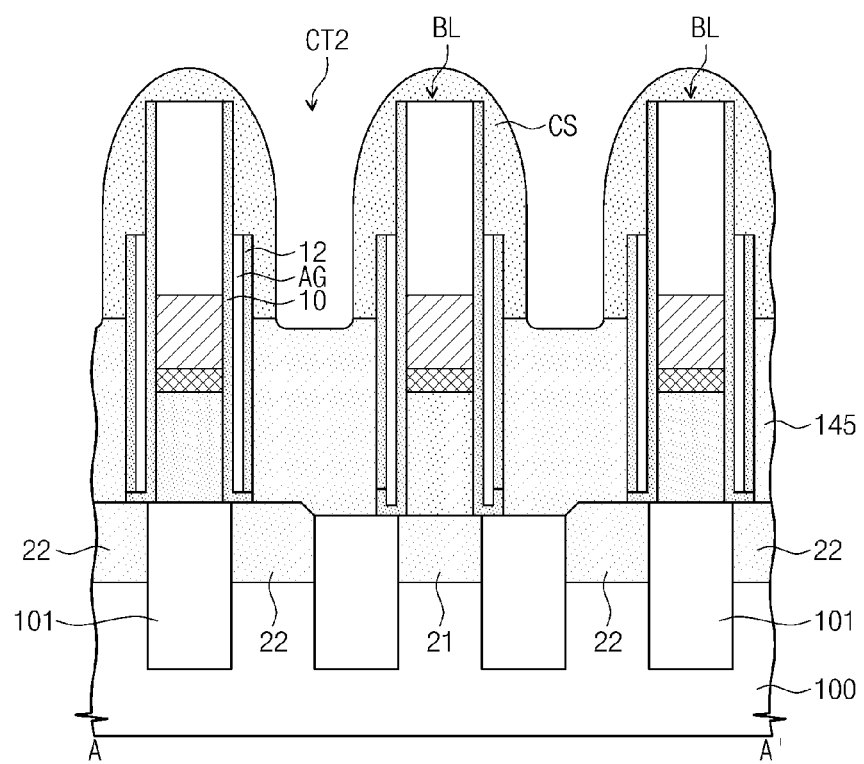
Figure 15B:
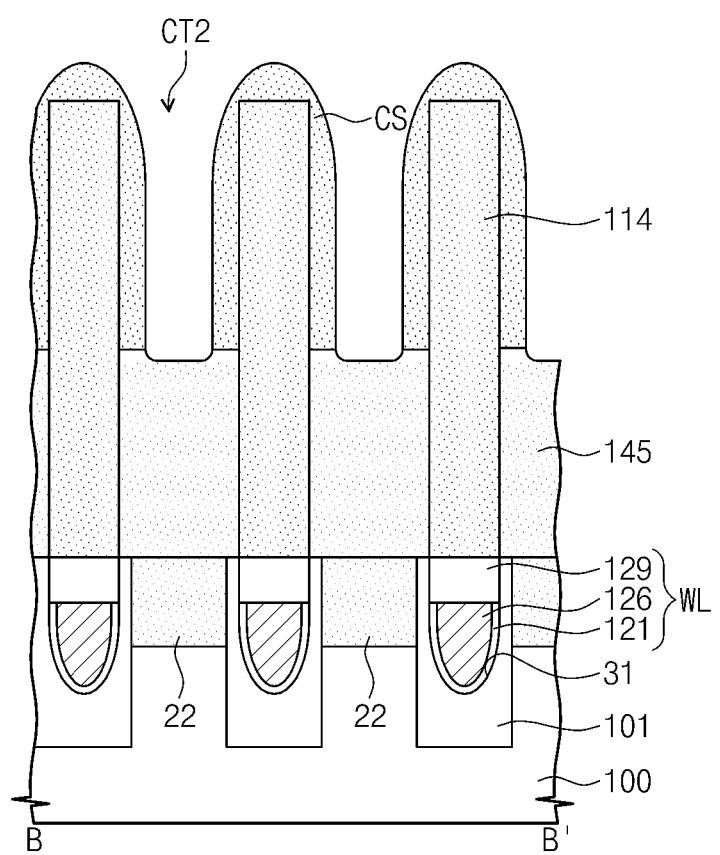

Referring to FIGS. 1, 15A, and 15B, an etching process may be performed on the capping insulating layer CL to form a capping spacer CS. The etching process of the capping layer CL may include, for example, a dry etching process having a strong anisotropic characteristic. Second contact holes CT2 may be formed to expose the top surfaces of the lower contact patterns 145 by the etching process of the capping insulating layer CL. The top surfaces of the lower contact patterns 145 may also be etched during the etching process of the capping insulating layer CL.

Figure 16A:
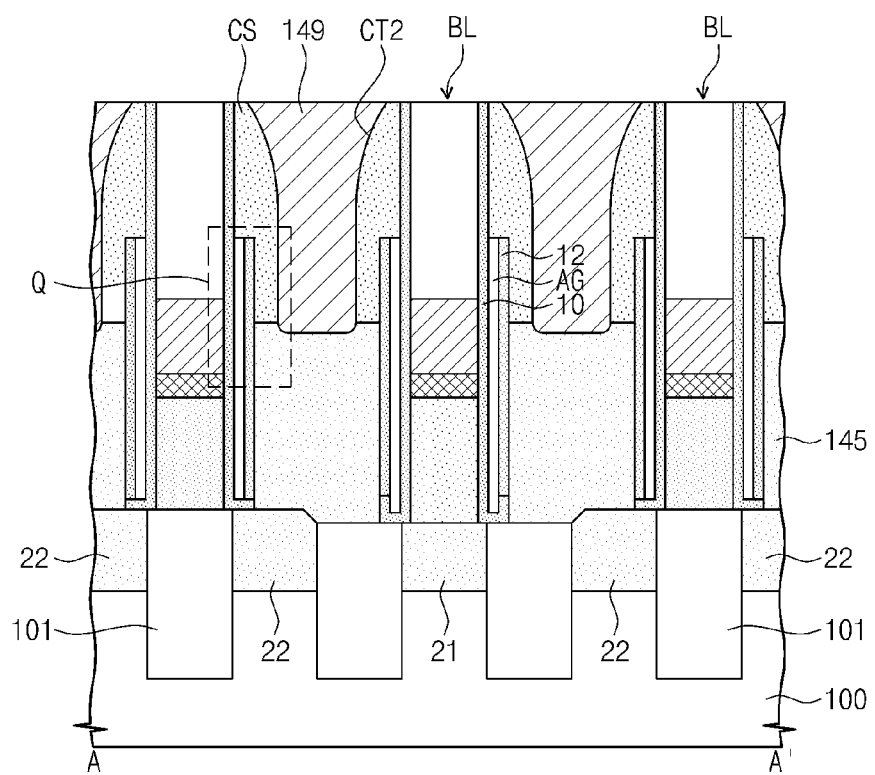
Figure 16B:
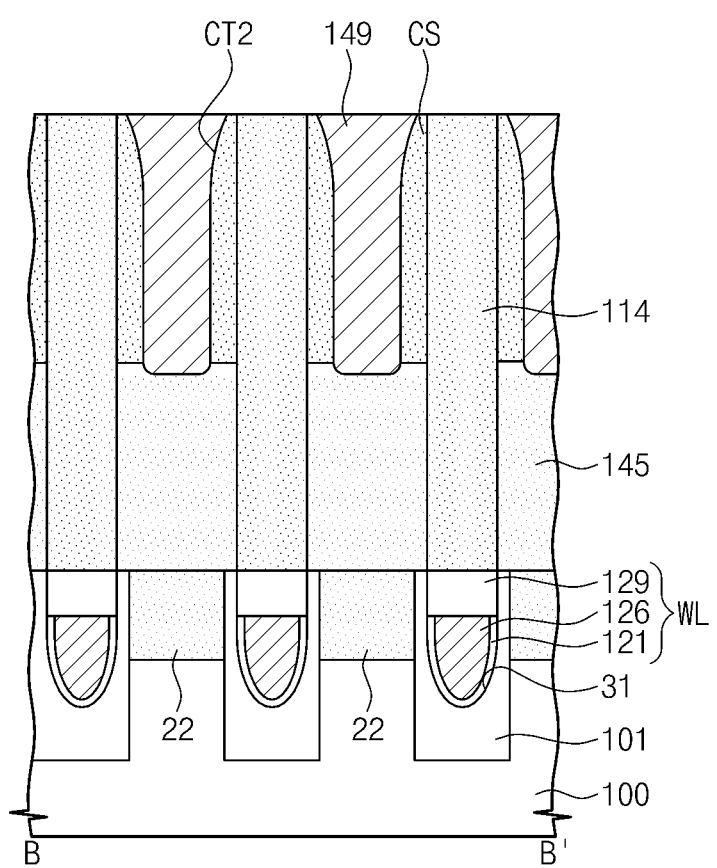

Referring to FIGS. 1, 16A, and 16B, upper contact patterns 149 may be formed to fill the second contact holes CT2 on the lower contact patterns 145, respectively. For example, the upper contact patterns 149 may include a metal or a conductive metal nitride. A conductive layer may be formed on the lower contact patterns 145 and then a planarization process may be performed on the conductive layer to form the upper contact patterns 149 in the second contact holes CT2, respectively. The upper contact patterns 149 are separated from each other. Each contact formed an upper and lower contact pattern may be described herein as including an upper contact portion and a lower contact portion.

Figure 16C:
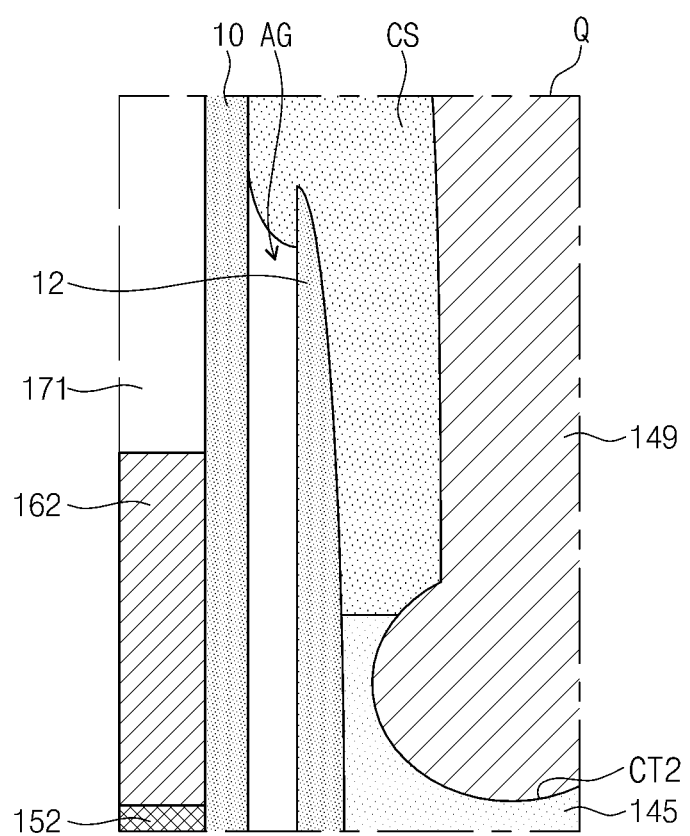
FIG. 16C is an exemplary enlarged view of a region Q of FIG. 16A.
Figure 16D:
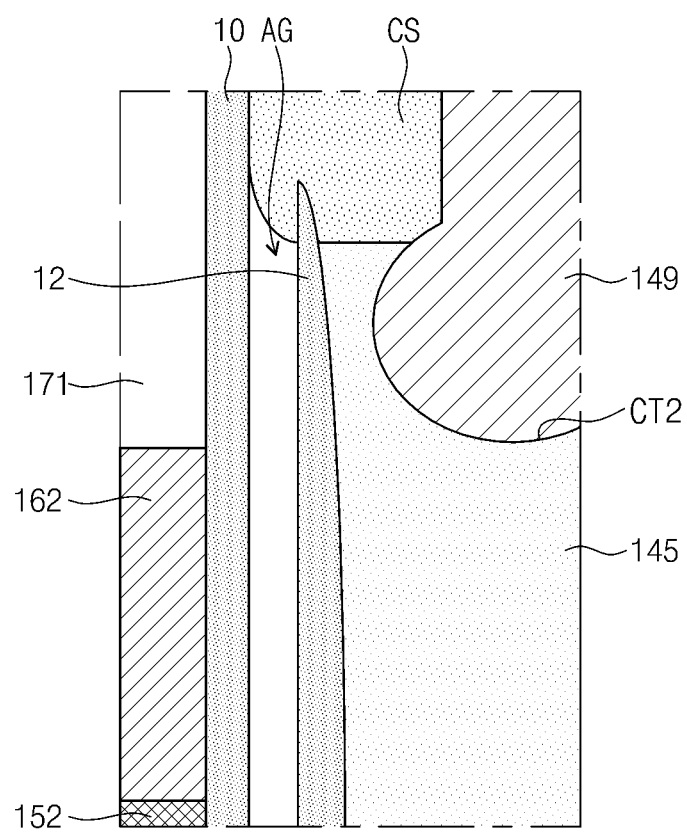
FIG. 16D is an exemplary enlarged view of a contact structure according to a comparison example.

FIG. 16C is an exemplary enlarged view of a region Q of FIG. 16A. FIG. 16D is an exemplary enlarged view of a contact structure according to a comparison example.

As illustrated in FIG. 16D, if the capping spacer CS is formed without the etching process described with reference to FIGS. 13A and 13B according to the comparison example, a lower part of the second contact hole CT2 is formed to be adjacent to an upper portion of the third spacer 12. The lower contact patterns 145 may also be etched during the etching process for the formation of the second contact holes CT2 described with reference to FIGS. 15A and 15B. In this case, an etch rate of the lower contact patterns 145 may be greater than that of the capping spacer CS, and the lower contact patterns 145 may be isotropically etched. As a result, the lower part of the second contact hole CT2 may be wider than an upper part of the second contact hole CT2 and may have a rounded shape, as illustrated in FIG. 16D.

The upper portion of the third spacer 12 may be thinner than a lower portion of the third spacer 12. As such, the third spacer 12 may have a tapered shape from bottom to top. According to the comparison example, the lower part of the second contact hole CT2 is adjacent to the upper portion of the third spacer 12, and an interface between the capping spacer CS and the lower contact pattern 145 is also adjacent to the upper portion of the third spacer 12. As a result, the third spacer 12 may not completely protect the air gap AG. Additionally, a permeation probability of atoms of the upper contact pattern 149 into the air gap AG increases. Thus, interference and/or a short may occur between the bit lines BL and the upper contact patterns 149.

According to embodiments disclosed herein, a lower part of the second contact hole CT2 may be formed to be adjacent to the relatively thick lower portion of the third spacer 12. As can be seen in FIG. 16C, third spacer 12 includes a relatively thin portion (e.g., at the top) and a relatively thick portion (e.g., at and below a top of the second second semiconductive pattern 162). Because the capping spacer CS extends to the relatively thick portion of the third spacer 12, it forms a better plug to prevent substances from filling the air gap. As a result of the exemplary structure depicted in FIG. 16C, when compared to the second conductive pattern 162, a bottom of the second contact hole CT2 as well as a bottom of the capping spacers may be lower than a top of the second conductive pattern 162. As a result, the air gap AG may be completely protected by the third spacer 12 and the capping spacer CS such that the interference and/or the short between the bit lines BL and the upper contact patterns 149 may be prevented.

Figure 17A:
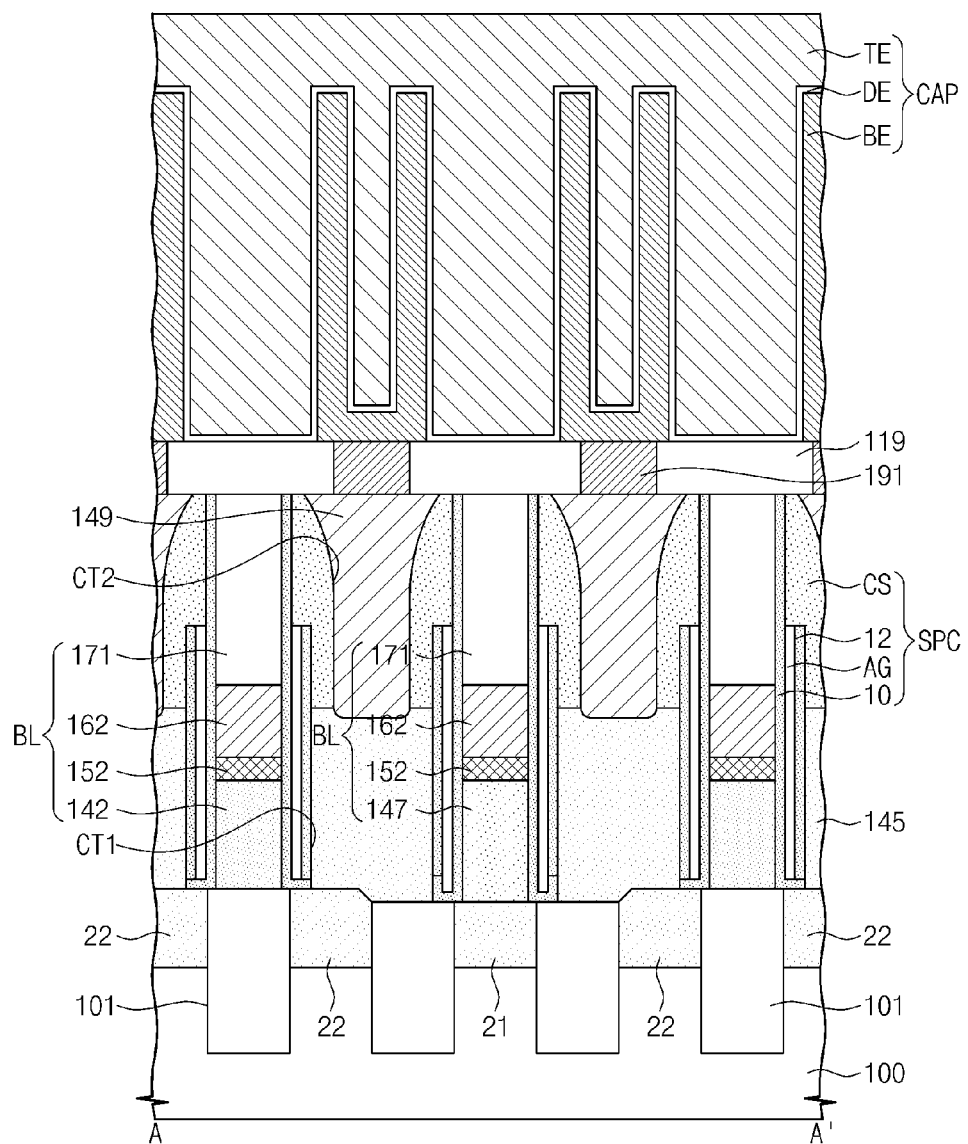
Figure 17B:
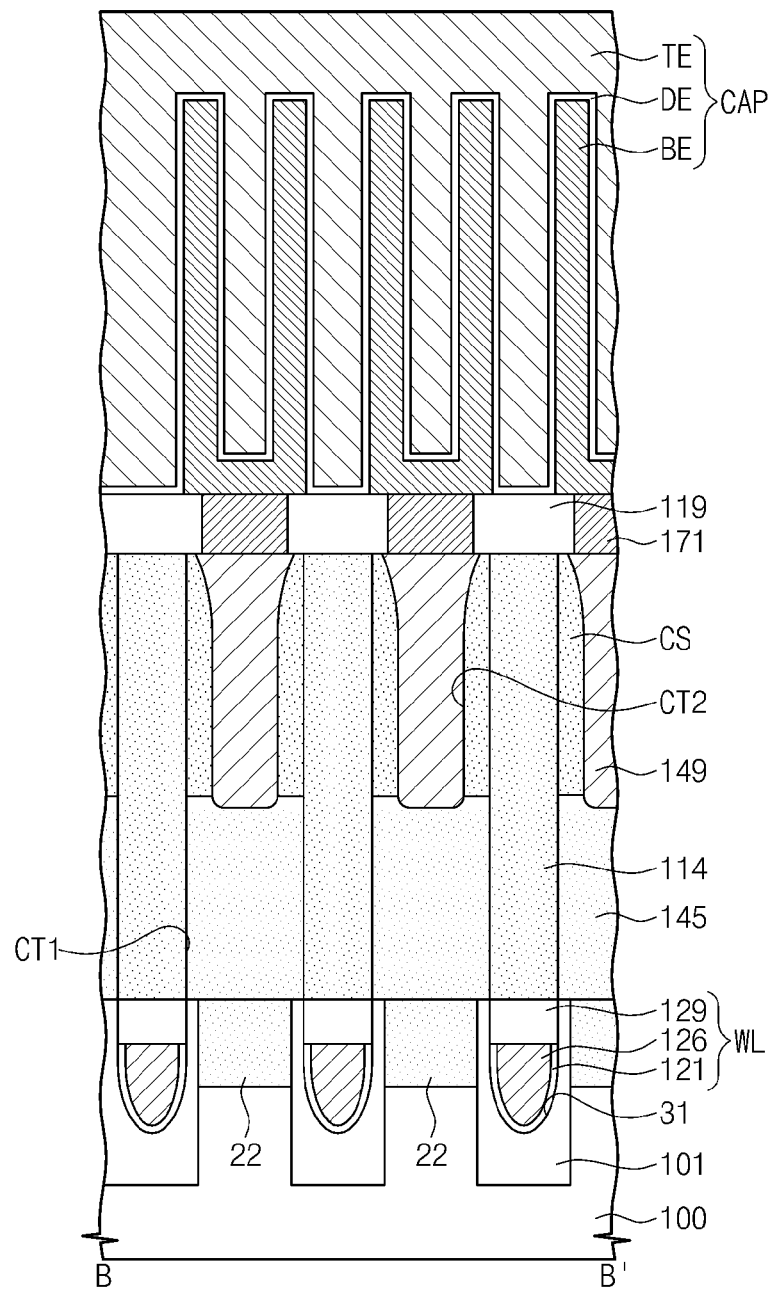

Referring to FIGS. 1, 17A, and 17B, data storage parts may be provided to be connected to the upper contact patterns 149. If the semiconductor device according to some embodiments is a dynamic random access memory (DRAM) device, the data storage parts connected to the upper contact patterns 149 may be capacitors CAP. Conductive pads 191 penetrating an interlayer insulating layer 119 may be provided on the upper contact patterns 149, and the upper contact patterns 149 may be electrically connected to the capacitors CAP through the conductive pads 191.

The capacitors CAP may include lower electrodes BE, an upper electrode TE, and an insulating layer DE between the upper electrode TE and the lower electrodes BE. In some embodiments, each of the lower electrodes BE may be formed to have a cylinder shape of which a bottom surface is closed. The formation process of the lower electrodes BE may include, for example, forming a sacrificial layer exposing the upper contact patterns 149 on the result structure having the upper contact patterns 149, conformally forming a conductive layer on the sacrificial layer, and forming a filling layer on the conductive layer. The conductive layer may be divided into the lower electrodes BE separated from each other on the upper contact patterns 149 by an etching process, and then the sacrificial layer and the filling layer may be removed. Thereafter, the insulating layer DE and the upper electrode TE may be sequentially formed on the lower electrodes BE.

According to certain embodiments, the bottom surfaces of the upper contact patterns may be formed to be lower than the top surfaces of the second conductive patterns so that the interference and/or the short between the bit lines and the upper contact patterns may be prevented.

The semiconductor device will be described with reference to FIGS. 1, 17A, and 17B.

The semiconductor device includes a substrate, such as substrate 100 may be provided. For example, the substrate 100 may be a semiconductor substrate including silicon, germanium, or silicon-germanium. The substrate 100 may include a cell array region and a peripheral circuit region. Memory cells may be disposed in the cell array region. A word line driver, a sense amplifier, row and column decoders, and control circuits may be disposed in the peripheral circuit region. A device isolation layer 101 may be provided in the substrate 100 to define active regions AR. In one embodiment, the active regions AR have bar-shapes laterally spaced apart from each other in a plan view. Each of the active regions AR may extend in the third direction (i.e., an s-direction) non-perpendicular to either of the x-direction or y-direction.

First and second dopant regions 21 and 22 may be provided in upper portions of the active regions AR. The dopant regions 21 and 22 may be doped with dopants of a different conductivity type from the substrate 100. In one embodiment, the first dopant region 21 is provided between a pair of second dopant regions 22 in each of the active regions AR. The first dopant region 21 and the second dopant regions 22 may be separated from each other by trenches 31 in each of the active regions AR.

In one embodiment, gate structures are buried in the substrate 100. The gate structures may be word lines WL. The word lines WL may be provided in the trenches 31 and may extend in the y-direction. Each of the word lines WL may include a gate insulating layer 121, a gate electrode 126, and a gate capping pattern 129 which are sequentially stacked in each of the trenches 31.

In one embodiment, conductive lines are connected to the first dopant regions 21. The conductive lines may extend in the x-direction. The conductive lines may be bit lines BL. Each of the bit lines BL may include first conductive patterns 147, a barrier pattern 152, a second conductive pattern 162, and a capping pattern 171. The barrier pattern 152, the second conductive pattern 162, and the capping pattern 171 may be sequentially stacked on the first conductive patterns 147. The first conductive patterns 147 may be connected to the first dopant regions 21. The bit lines BL may further include first semiconductor patterns 142. In each of the bit lines BL, the first semiconductor patterns 142 and the first conductive patterns 147 may be alternately arranged along an extending direction (e.g., the x-direction) of the bit lines BL under the barrier pattern 152.

Spacer structures SPC may be provided on sidewalls of the bit lines BL. Each of the spacer structures SPC may include a first spacer 10 and a third spacer 12 sequentially formed on the sidewall of each of the bit lines BL. An air gap AG may be provided between the first spacer 10 and the third spacer 12. The air gap AG may be covered by a capping spacer CS. For example, a sidewall and a bottom surface (also referred to as a bottom terminal end) of the air gap AG may be defined by the first and third spacers 10 and 12, and a top surface of the air gap AG (also referred to as a top terminal end) may be defined by the capping spacer CS. The air gap AG may be a substantially empty region in which a solid phase material is not provided. The air gap AG, having a lower dielectric constant than a silicon oxide layer or a silicon nitride layer, may minimize a parasitic capacitance influencing the bit lines BL. Thus, a response time of the semiconductor device may be reduced.

In one embodiment, fence patterns 114 are provided to cross the bit lines BL. The fence patterns 114 may extend along the word lines WL in the y-direction and may be spaced apart from each other in the x-direction. The fence patterns 114 and the spacer structures SPC may define first contact holes CT1, and lower contact patterns 145 may be provided in the first contact holes CT1. The lower contact patterns 145 may be connected to the second dopant regions 22. For example, the lower contact patterns 145 may include a doped poly-silicon. A bottom surface of the capping spacer CS may be in contact with a top surface of the lower contact pattern 145.

In one embodiment, upper contact patterns 149 are provided on the lower contact patterns 145, respectively. The upper contact patterns 149 may be provided in second contact holes CT2 defined by sidewalls of the capping spacer CS. For example, the upper contact patterns 149 may include a metal or a conductive metal nitride. Bottom surfaces of the upper contact patterns 149 may be lower than an interface between the capping spacer CS and the lower contact pattern 145. Lower portions of the upper contact patterns 149 may be inserted into upper portions of the lower contact patterns 145.

In certain embodiments, the bottom surfaces of the upper contact patterns 149 are lower than the top surface of the second conductive pattern 162. The bottom surfaces of the upper contact patterns 149 may be lower than the top surface of the air gap AG and the top surface of the third spacer 12.

Data storage parts may be electrically connected to the second dopant regions 22. If the semiconductor device according to some embodiment is a DRAM device, capacitors CAP as the data storage parts may be provided to be electrically connected to the second dopant regions 22. The capacitors CAP may include, for example, lower electrode BE, an upper electrode TE, and an insulating layer DE between the upper electrode TE and the lower electrodes BE.

According to some embodiments, the bottom surfaces of the upper contact patterns may be formed to be lower than the top surfaces of the second conductive patterns, so that interference and/or a short between the bit lines and the upper contact patterns may be prevented.

FIGS. 18A to 20A are cross-sectional views taken along a line A-A' of FIG. 1 to illustrate a method of forming a semiconductor device according to other exemplary embodiments. FIGS. 18B to 20B are cross-sectional views taken along a line B-B' of FIG. 1 to illustrate a method of forming a semiconductor device according to other exemplary embodiments.

Figure 18A:
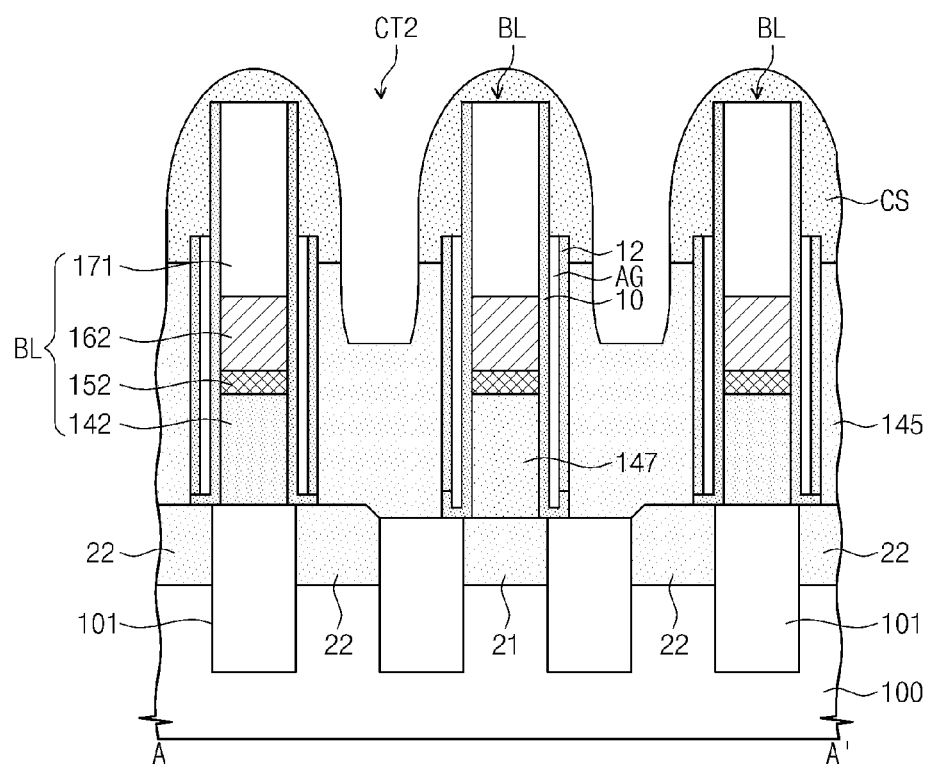
Figure 18B:
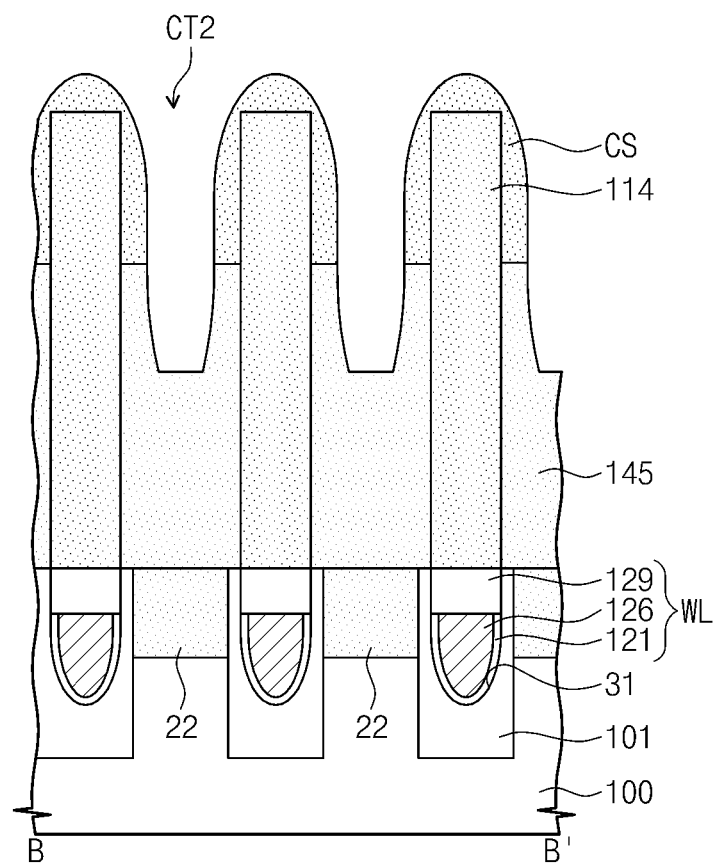

Referring to FIGS. 1, 18A, and 18B, a capping spacer CS may be formed on the resultant structure described with reference to FIGS. 12A and 12B. In some embodiments, a capping insulating layer may be formed on the resultant structure described with reference to FIGS. 12A and 12B and then an anisotropic etching process may be performed on the capping insulating layer to form the capping spacer CS. Upper portions of the preliminary lower contact patterns 144 of FIGS. 12A and 12B may be etched by the anisotropic etching process, thereby forming lower contact patterns 145. As a result, second contact holes CT2 defined by the capping spacer CS and the lower contact patterns 145 may be formed. In some embodiments, bottom surfaces of the second contact holes CT2 may be lower than the top surfaces of the second conductive patterns 162.

Figure 19A:
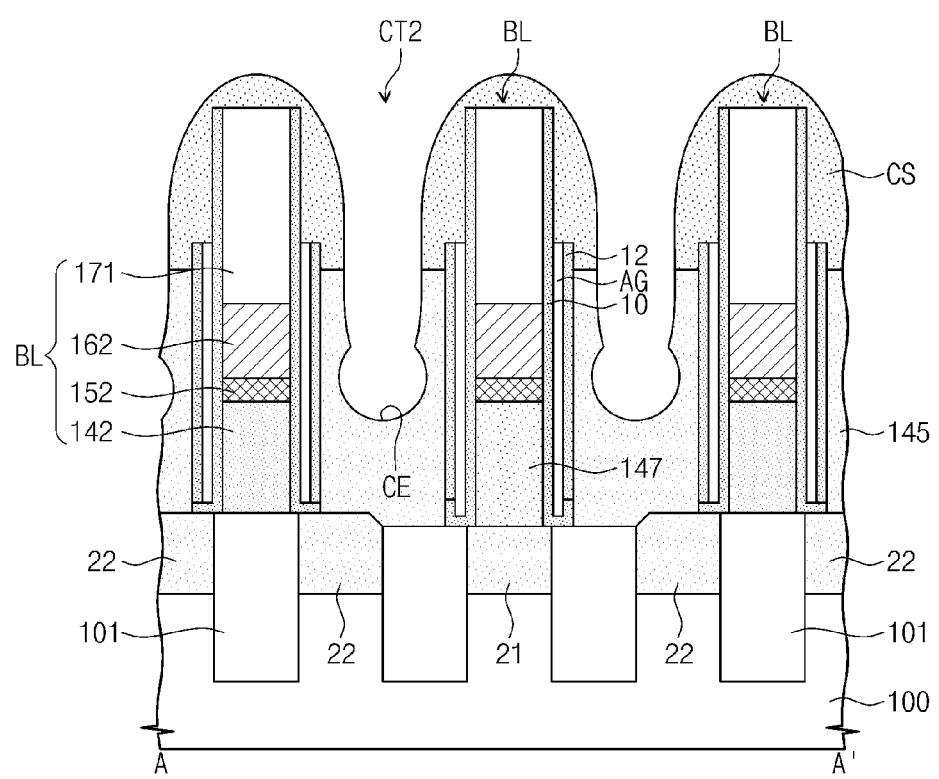
Figure 19B:
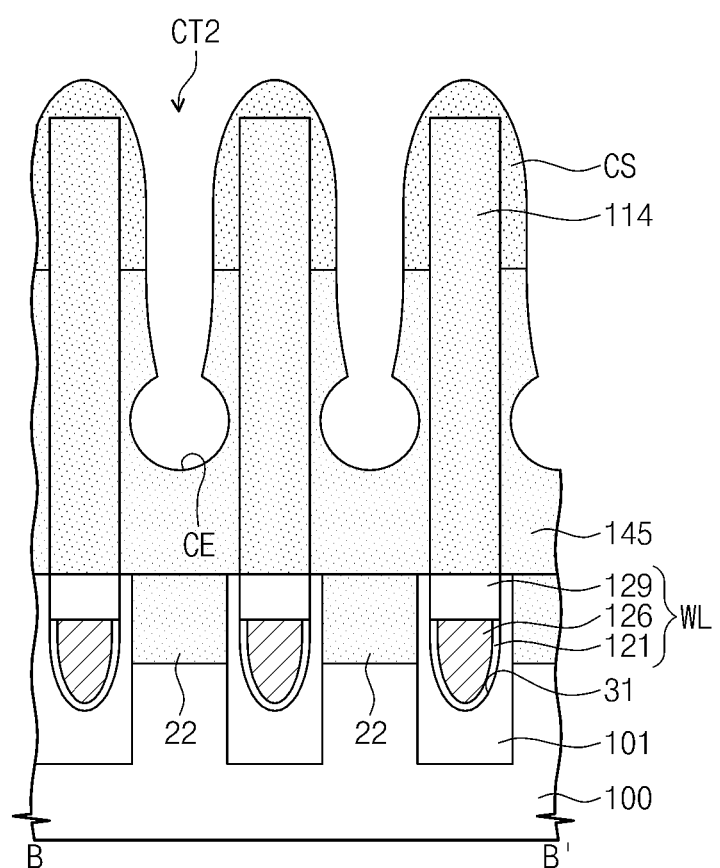

Referring to FIGS. 1, 19A, and 19B, the lower contact patterns 145 exposed by the second contact holes CT2 may be further etched to form contact hole-extending parts CE. The contact hole-extending parts CE may be defined by inner sidewalls of the lower contact patterns 145. The second contact holes CT2 may extend toward the substrate 100 by the contact hole-extending parts CE. In some embodiments, bottom surfaces of the contact hole-extending parts CE may be lower than the bottom surface of the barrier pattern 152. The contact hole-extending parts CE may be formed by an isotropic etching process.

Figure 20A:
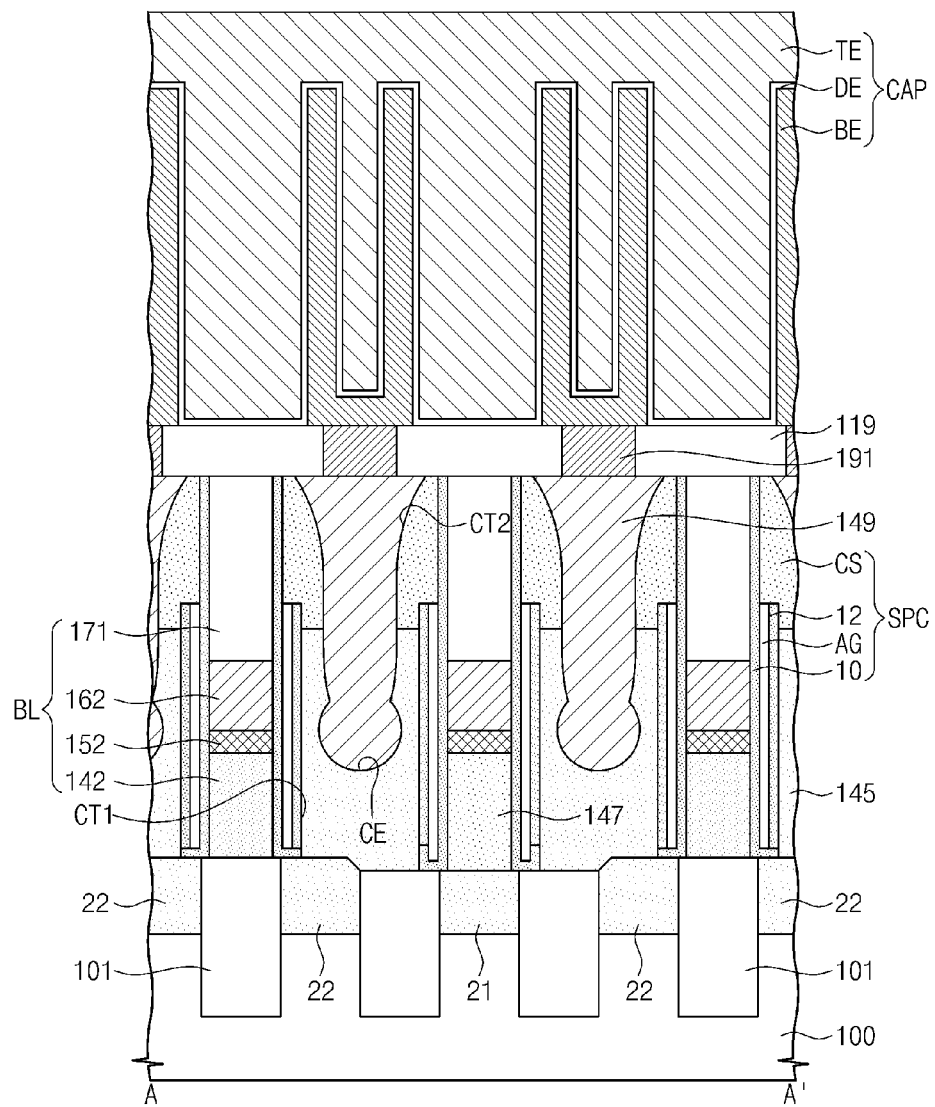
Figure 20B:
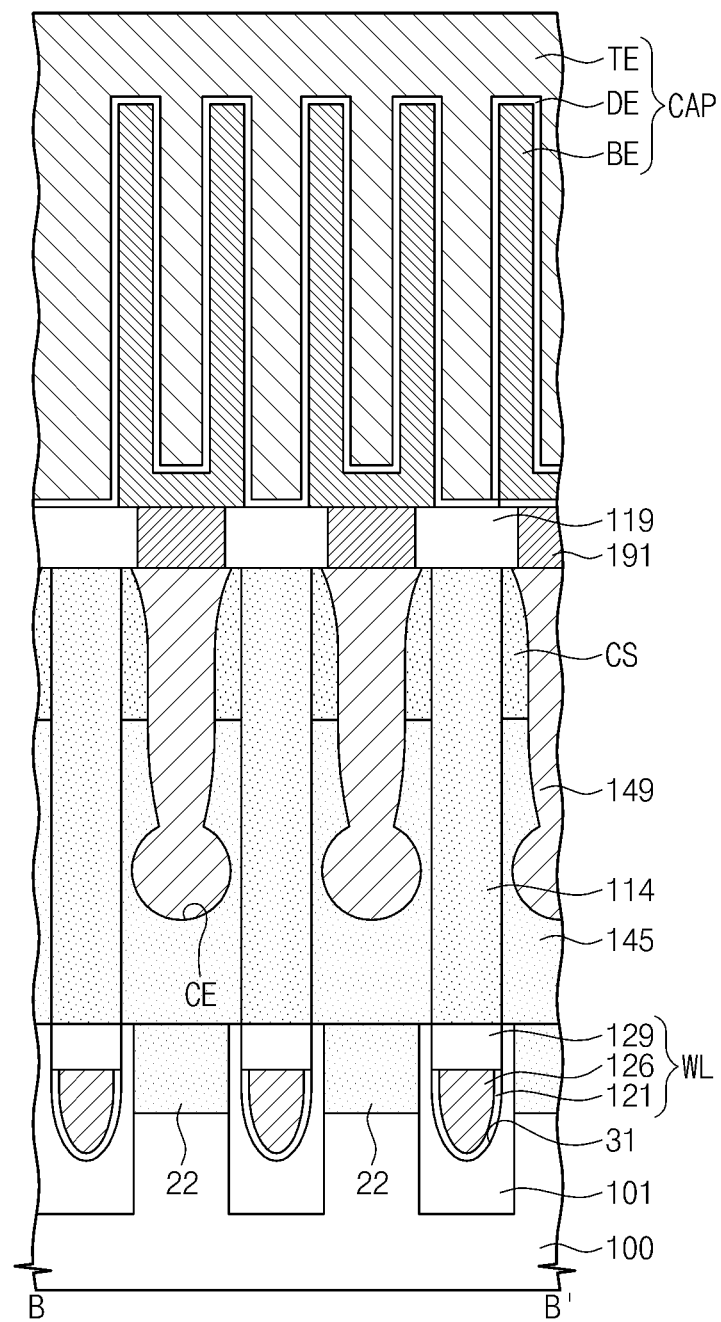

Referring to FIGS. 1, 20A, and 20B, upper contact patterns 149 may be formed to fill the second contact holes CT2, respectively. For example, the upper contact patterns 149 may include a metal or a conductive metal nitride. In some embodiments, a conductive layer may be formed on the resultant structure having the contact hole-extending parts CE and then a planarization process may be performed on the conductive layer to form the upper contact patterns 149 separated from each other. Thereafter, the conductive pads 191 penetrating the interlayer insulating layer 119 may be formed on the upper contact patterns 149 and then the capacitors CAP may be formed on the conductive pads 191, as described with reference to FIGS. 17A and 17B.

The semiconductor devices described above may be encapsulated using various packaging techniques. For example, the semiconductor devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique. The package in which the semiconductor device according to one of the above embodiments is mounted may further include a controller and/or a logic device that controls the semiconductor device.

Figure 21:
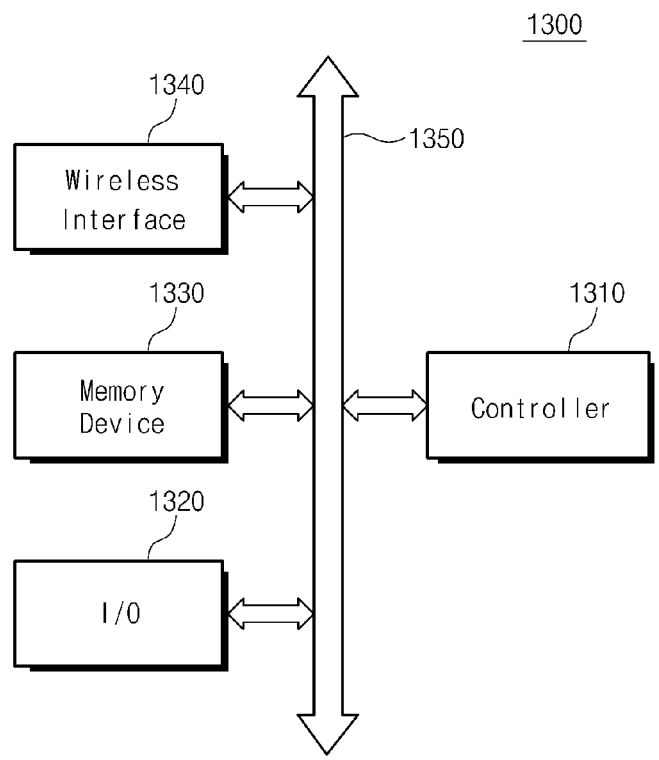
FIG. 21 is a schematic block diagram illustrating an example of electronic devices including semiconductor devices according to exemplary embodiments.

FIG. 21 is a schematic block diagram illustrating an example of electronic devices including semiconductor devices according to certain embodiments.

Referring to FIG. 21, an electronic device 1300 according to certain embodiments may be a personal digital assistant (PDA), a laptop computer, a portable computer, web tablet, a wireless phone, a mobile phone, a digital music player, a wire/wireless electronic device, or a complex electronic device including at least two thereof. The electronic device 1300 may include a controller 1310, an input/output (I/O) unit 1320 (e.g., a keypad, a keyboard and/or a display), a memory device 1330, and wireless interface unit 1340 which are combined with each other through a data bus 1350. For example, the controller 1310 may include at least one of a microprocessor, a digital signal processor, a microcontroller or other logic devices. The other logic devices may have a similar function to any one of the microprocessor, the digital signal processor and the microcontroller. The memory device 1330 may store, for example, commands performed by the controller 1310. Additionally, the memory device 1330 may be used for storing a user data. The memory device 1330 includes at least one of the semiconductor devices according to the aforementioned embodiments. The electronic device 1300 may use the wireless interface unit 1340 for transmitting data to a wireless communication network communicating with a radio frequency (RF) signal or receiving data from the network. For example, the wireless interface unit 1340 may include an antenna or a wireless transceiver. The electronic device 1300 according to various embodiments may be used in a communication interface protocol such as a third generation communication system (e.g., CDMA, GSM, NADC, E-TDMA, WCDAM, and/or CDMA2000).

Figure 22:
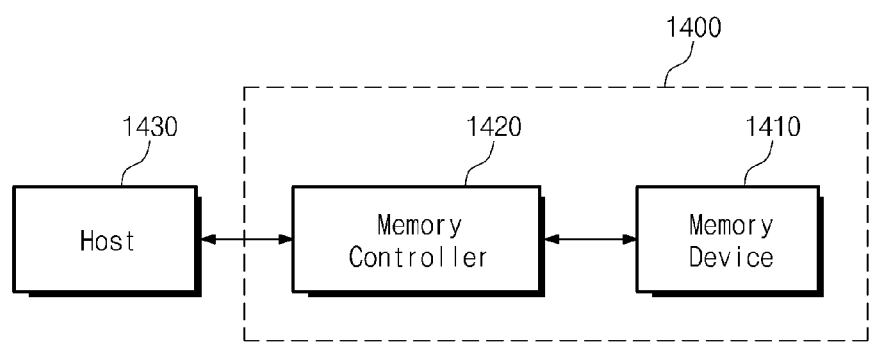
FIG. 22 is a schematic block diagram illustrating an example of memory systems including semiconductor devices according to exemplary embodiments.

FIG. 22 is a schematic block diagram illustrating an example of memory systems including semiconductor devices according to embodiments of the inventive concept.

Referring to FIG. 22, the semiconductor devices according to the aforementioned embodiments may be used for realizing a memory system. A memory system 1400 may include a memory device 1410 and a memory controller 1420 for storing massive data. The memory controller 1420 may read or write data from/into the memory device 1410 in response to read/write request of a host 1430. The memory controller 1420 may make an address mapping table for mapping an address provided from the host 1430 (e.g., a mobile device or a computer system) into a physical address of the memory device 1410. The memory device 1410 may include the semiconductor device according to the above embodiments.

According to embodiments described herein, the semiconductor device with improved electrical characteristics may be realized. Additionally, the semiconductor device with improved integration density may be realized.

While this disclosure has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
   gate structures on a substrate;
   first dopant regions and second dopant regions disposed at both sides of the gate structures;
   conductive lines crossing the gate structures and connected to the first dopant regions, each of the conductive lines including a conductive pattern and a capping pattern on the conductive pattern;
   contact structures provided between the conductive lines and connected to the second dopant regions;
   spacer structures between the conductive lines and the contact structures,
   wherein each of the contact structures includes a lower contact pattern on a respective second dopant region and an upper contact pattern on the lower contact pattern;
   wherein a bottom surface of the upper contact pattern is lower than a top surface of the conductive pattern; and
   wherein each of the spacer structures includes an air gap, and an insulating spacer between the air gap and an adjacent contact structure; and
   a capping spacer covering the air gap and the insulating spacer,
   wherein a bottom surface of the capping spacer is in contact with a top surface of the lower contact pattern and the bottom surface of the upper contact pattern is lower than an interface between the capping spacer and the lower contact pattern.

2. The semiconductor device of claim 1, wherein the bottom surface of the upper contact pattern is lower than a top surface of the air gap and a top surface of the insulating spacer.

3. The semiconductor device of claim 1, wherein the lower contact pattern includes a semiconductor; and
   wherein the upper contact pattern includes a metal.

4. The semiconductor device of claim 1, wherein a lower portion of the upper contact pattern is disposed within an upper portion of the lower contact pattern.

5. The semiconductor device of claim 1, further comprising:
   fence patterns provided on the gate structures and extending along the gate structures,
   wherein the contact structures are provided in contact holes defined by the conductive lines and the fence patterns.

6. The semiconductor device of claim 1, further comprising:
   capacitors on the contact structures.

7. A semiconductor device comprising:

a substrate;

a plurality of bit line structures formed on the substrate, each bit line structure extending in a first direction, wherein each bit line structure includes a first semiconductor layer, a conductive layer on the first semiconductor layer, and a capping layer on the conductive layer, wherein the conductive layer is disposed above the first semiconductor layer and below the capping layer;

a plurality of word lines, each word line extending in a second direction different from the first direction;

a plurality of contact structures, each provided between two adjacent bit line structures of the plurality of bit line structures, wherein each contact structure includes a lower contact portion and an upper contact portion, wherein a bottom surface of the upper contact portion contacts a top surface of the lower contact portion at a contact structure interface; and a plurality of spacer structures, each spacer structure located between a bit line structure and a contact structure and including at least an air gap, an insulating spacer between the air gap and the contact structure, and a capping spacer, wherein each capping spacer covers a top of a corresponding air gap, extends between a bit line structure and a contact structure from above the top of the corresponding air gap to a first height below the top of the corresponding air gap, and fills an area between the insulating spacer and the contact structure, wherein the first height is lower than a top of the conductive layer of a bit line structure adjacent to the capping spacer.

8. The semiconductor device of claim 7, wherein:

the contact structure interface for each contact structure is located at a second height lower than the first height.

9. The semiconductor device of claim 7, further comprising:

a first dopant region disposed below a first bit line structure of the plurality of bit line structures; and a second dopant region disposed below a first contact structure of the plurality of contact structures.

10. The semiconductor device of claim 9, wherein:

the first dopant region contacts a first semiconductor layer of the first bit line structure; and the second dopant region contacts the first contact structure.

11. The semiconductor device of claim 7, wherein:

for each capping spacer, the capping spacer fills an area between a corresponding insulating spacer and a corresponding bit line structure to a height above the first height and below a top of the corresponding insulating spacer.

12. A semiconductor device comprising:

gate structures on a substrate;

first dopant regions and second dopant regions disposed at both sides of the gate structures;

conductive lines crossing the gate structures and connected to the first dopant regions, each of the conductive lines including a conductive pattern and a capping pattern on the conductive pattern;

contact structures provided between the conductive lines and connected to the second dopant regions;

capacitors disposed on the contact structures and electrically connected to the second dopant regions through the contact structures, wherein each of the contact structures includes a lower contact pattern on a respective second dopant region and an upper contact pattern including a material different from the lower contact pattern on the lower contact pattern; and wherein a bottom surface of the upper contact pattern is lower than a top surface of the conductive pattern.

13. The semiconductor device of claim 12, wherein a lower portion of the upper contact pattern is inserted in an upper portion of the lower contact pattern.

14. The semiconductor device of claim 12, further comprising:

spacer structures between the conductive lines and the contact structures, wherein each of the spacer structures includes an air gap, and an insulating spacer between the air gap and an adjacent contact structure.

15. The semiconductor device of claim 14, wherein the bottom surface of the upper contact pattern is lower than a top surface of the air gap and a top surface of the insulating spacer.

16. The semiconductor device of claim 14, further comprising:

a capping spacer covering the air gap and the insulating spacer, wherein a bottom surface of the capping spacer is in contact with a top surface of the lower contact pattern.

17. The semiconductor device of claim 12, wherein the lower contact pattern includes a semiconductor; and wherein the upper contact pattern includes a metal.

* * * * *